US012648179B2

(12) United States Patent
Frougier et al.

(10) Patent No.: US 12,648,179 B2
(45) Date of Patent: Jun. 2, 2026

(54) CO-INTEGRATION OF SOURCE-DRAIN TRENCH METAL CUT AND GATE-CONTACT-OVER ACTIVE DEVICE FOR ADVANCED TRANSISTOR ARCHITECTURES

(71) Applicant: INTERNATIONAL BUSINESS MACHINES CORPORATION, Armonk, NY (US)

(72) Inventors: Julien Frougier, Albany, NY (US); Sagarika Mukesh, Albany, NY (US); Albert M Chu, Nashua, NH (US); Ruilong Xie, Niskayuna, NY (US); Andrew M. Greene, Slingerlands, NY (US); Eric Miller, Watervliet, NY (US); Junli Wang, Slingerlands, NY (US); Veeraraghavan S. Basker, Fremont, CA (US); Prateek Hundekar, Guilderland, NY (US); Tushar Gupta, Albany, NY (US); Su Chen Fan, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 825 days.

(21) Appl. No.: 17/653,468

(22) Filed: Mar. 4, 2022

(65) Prior Publication Data

US 2023/0282722 A1 Sep. 7, 2023

(51) Int. Cl.
H10D 30/67 (2025.01)
H10D 30/01 (2025.01)
(Continued)

(52) U.S. Cl.
CPC ....... H10D 30/6735 (2025.01); H10D 30/031 (2025.01); H10D 30/6713 (2025.01);
(Continued)

(58) Field of Classification Search
CPC ....... H10D 30/67–6759; H10D 62/119; H10D 30/6219; H10D 30/62; H10D 30/501; H10D 62/115–116; H10D 62/151
See application file for complete search history.

(56) References Cited

U.S. PATENT DOCUMENTS

| 7,002,187 B1 | 2/2006 | Husher |
| 9,570,395 B1 | 2/2017 | Sengupta |

(Continued)

FOREIGN PATENT DOCUMENTS

EP          3454366 A1          3/2019

OTHER PUBLICATIONS

Gupta et al., "Buried Power Rail Integration with Si FinFETs for CMOS Scaling beyond the 5 nm Node", 2020 Symposium on VLSI Technology Digest of Technical Papers—THL.6, © 2020 IEEE, 2 pages.

(Continued)

*Primary Examiner* — Britt Hanley
*Assistant Examiner* — Jason James Greaving
(74) *Attorney, Agent, or Firm* — Samuel A. Waldbaum

(57) ABSTRACT

A semiconductor device including a first nanodevice is located on a substrate, where the first nanodevice includes at least one channel. A first source/drain connected to the first nanodevice. A second nanodevice located on the substrate, where the second nanodevice includes at least one channel and a second source/drain connected to the second nanodevice. A first contact located above the first source/drain. A second contact located above the second source/drain. A contact cap located on top of the first contact and the second contact, where the contact cap has a first leg that extends downwards between the first contact and the second contact.

(Continued)

The first leg of the contact cap is in contact with a first sidewall of the first contact, and a first sidewall of the second contact.

16 Claims, 24 Drawing Sheets

(51) Int. Cl.
*H10D 62/10* (2025.01)
*H10D 84/01* (2026.01)
*H10D 84/03* (2025.01)
*H10W 20/20* (2026.01)

(52) U.S. Cl.
CPC ..... *H10D 30/6729* (2025.01); *H10D 30/6757* (2025.01); *H10D 62/118* (2025.01); *H10D 84/0128* (2025.01); *H10D 84/013* (2025.01); *H10D 84/038* (2025.01); *H10W 20/20* (2026.01)

(56) References Cited

U.S. PATENT DOCUMENTS

| | | | |
|---|---|---|---|
| 9,691,897 B2 | 6/2017 | Xie | |
| 9,722,038 B2 | 8/2017 | Adusumilli | |
| 9,905,671 B2 | 2/2018 | Cheng | |
| 10,453,850 B2 | 10/2019 | Smith | |
| 10,522,410 B2 | 12/2019 | Economikos | |
| 10,580,773 B2 | 3/2020 | Bergendahl | |
| 10,784,365 B2 | 9/2020 | Basker | |
| 10,832,964 B1 | 11/2020 | Xie | |
| 10,840,345 B2 | 11/2020 | Greene | |
| 10,916,470 B2 | 2/2021 | Kamineni | |
| 11,004,750 B2 | 5/2021 | Xie | |
| 2018/0026042 A1 | 1/2018 | Smith | |
| 2019/0386011 A1 | 12/2019 | Weckx | |
| 2020/0006336 A1* | 1/2020 | Lung | H10D 62/83 |
| 2020/0058757 A1 | 2/2020 | Xie | |
| 2020/0134128 A1 | 4/2020 | Peng | |
| 2020/0135578 A1 | 4/2020 | Ching | |
| 2020/0135634 A1 | 4/2020 | Chiang | |
| 2020/0135932 A1* | 4/2020 | Wang | H10D 64/021 |
| 2020/0258779 A1 | 8/2020 | Cheng | |
| 2020/0279768 A1* | 9/2020 | Kamineni | H01L 21/76885 |
| 2021/0313448 A1* | 10/2021 | Wang | H10D 84/038 |

OTHER PUBLICATIONS

Oniki, "Cleaning Challenges Associated With Scaling Boosters and Performance Enhancement for Advanced Logic Devices", IMEC, SPCC 2019, Apr. 2-3, 2019, Portland, OR, US, 36 pages.

* cited by examiner

315

316

314

309

312

310
311

308

307

305

322

313    312

315

306

305

315
314
312
310
311
308
307
305
316
309
324

324
322
313
312
315
306
305

315
314
312
310
311
308
307

100

140

135

120    115A    115B

110

105

130

125

100

CO-INTEGRATION OF SOURCE-DRAIN TRENCH METAL CUT AND GATE-CONTACT-OVER ACTIVE DEVICE FOR ADVANCED TRANSISTOR ARCHITECTURES

BACKGROUND

The present invention generally relates to the field of nano devices, and more particularly to formation of the contacts and the preventing the shorting of the contacts.

Gate-All-Around (GAA) Nanosheet is the lead device architecture in continuing CMOS scaling. However, GAA nanosheet technology is still facing the fundamental scaling limitation of horizontal transport transistor architectures such as Contacted-gate-Poly-Pitch (CPP) reduction in the X-direction and Fin-to-Fin space reduction in Y-direction. The minimization of the NFET-to-PFET space in the Y-direction while preventing contact shorts between adjacent devices is a main challenge of advanced transistor architectures scaling.

BRIEF SUMMARY

Additional aspects and/or advantages will be set forth in part in the description which follows and, in part, will be apparent from the description, or may be learned by practice of the invention.

A semiconductor device including a first nanodevice is located on a substrate, where the first nanodevice includes at least one channel. A first source/drain connected to the first nanodevice. A second nanodevice located on the substrate, where the second nanodevice includes at least one channel and a second source/drain connected to the second nanodevice. A first contact located above the first source/drain. A second contact located above the second source/drain. A contact cap located on top of the first contact and the second contact, where the contact cap has a first leg that extends downwards between the first contact and the second contact. The first leg of the contact cap is in contact with a first sidewall of the first contact, and a first sidewall of the second contact.

A semiconductor device including a first nanodevice is located on a substrate, where the first nanodevice includes at least one channel. A first source/drain connected to the first nanodevice. A second nanodevice located on the substrate, where the second nanodevice includes at least one channel. A second source/drain connected to the second nanodevice. A first contact located above the first source/drain and a second contact located above the second source/drain. A first contact cap located on top of the first contact and a second contact cap located on top of the second contact. A first isolation layer located between a first sidewall of the first contact and a first sidewall of the second contact, where the first isolation layer is located between a first sidewall of the source/drain and a first sidewall of the second source/drain.

A method including forming a first nanodevice is located on a substrate, where the first nanodevice includes at least one channel. Forming a second nanodevice located on the substrate, where the second nanodevice includes at least one channel. Forming a first source/drain in a first dielectric layer connected to the first nanodevice. Forming a second source/drain in the first dielectric layer connected to the second nanodevice. Forming a combined contact that is located on around the first source/drain and the second source drain. Forming a separating trench in the combined contact, separating the combined contact in a first contact and a second contact. Forming a contact cap located on top of the first contact and the second contact, where the contact cap has a first leg that extends downwards between the first contact and the second contact. The first leg of the contact cap is in contact with a first sidewall of the first contact, and a first sidewall of the second contact.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
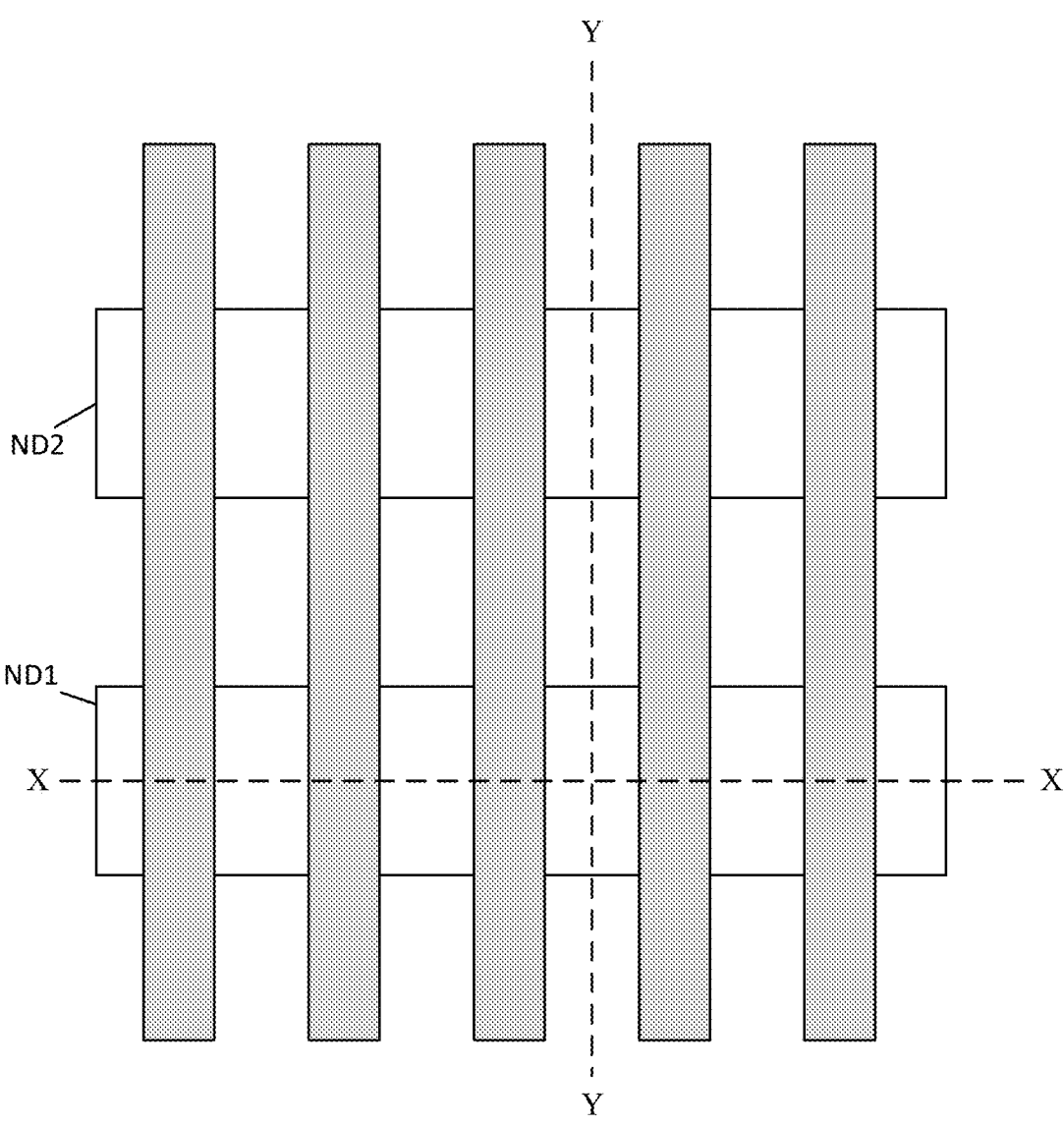
FIG. 1 is a top-down view illustrating adjacent devices, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. As nanosheet devices are scaling down with an ever-decreasing pitch it has become hard to form the necessary components in their correct position. For example, as the pitch is decreasing the amount of space available to form a contact is decreasing, thus leading to an increase in the probability that the contact will be misaligned. The misalignment causes the devices to short or other defects. The present invention enables co-integration of Gate-contact-over-Active and Trench Metal cut for aggressive tip-to-tip scaling. The present invention forms a combined contact over the source/drain between the devices. Since forming a combined contact the misalignment chances are reduced. The combined contact is cut to form separate contacts. The cut allows for a dielectric layer to be formed between the contacts and between portions of the source/drains that were exposed during formation of the combined contact.

FIG. 1 is a top-down view illustrating adjacent devices, in accordance with the embodiment of the present invention. The adjacent devices include a first nanodevice ND1 and a second nanodevice ND2. Cross-section X is a cross section perpendicular to the gates along the horizontal axis of the first nanodevice ND1 and cross-section Y is a cross section parallel to the gates in the Source-Drain region across both nanodevices (ND1 and ND2).

Figure 2:
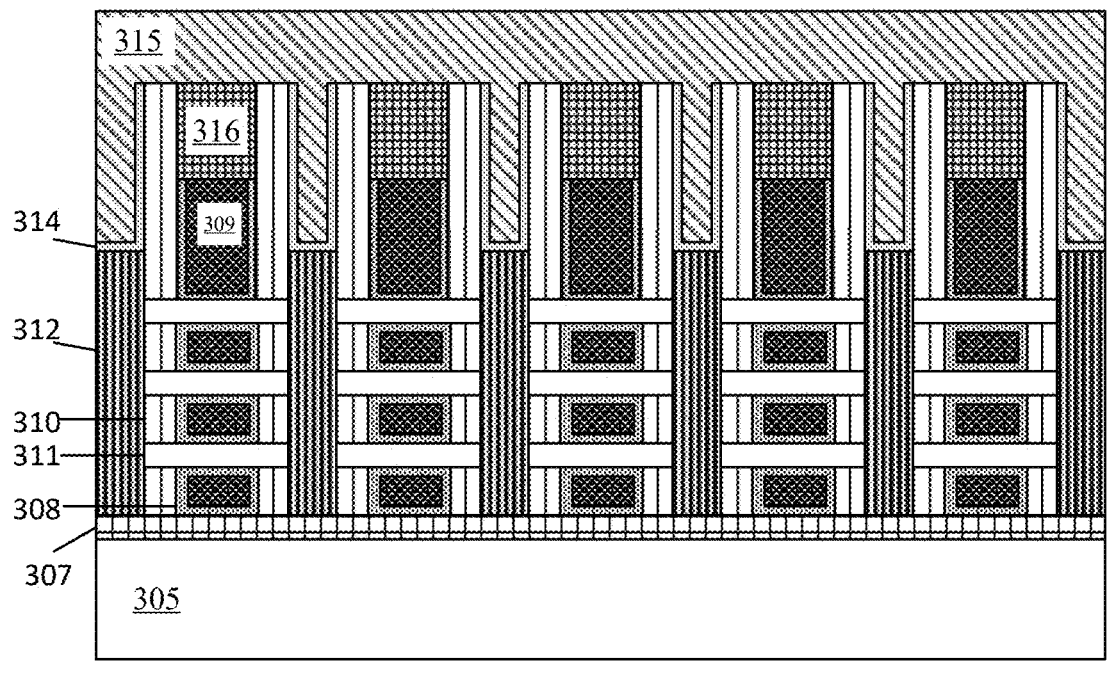
FIG. 2 illustrates cross-section X of the adjacent devices, in accordance with the embodiment of the present invention.

FIG. 2 illustrates cross-section X of the adjacent devices, in accordance with the embodiment of the present invention. The first nanodevice ND1 includes a substrate 305, a bottom dielectric layer 307, a plurality of nanosheets 311, a plurality of inner spacers 310, a first source/drain 312, an etch stop liner 314, a gate liner 308, a gate 309, a gate cap 316, a first dielectric layer 315. Only one nanosheet column is numbered but it is within the skill level of one of ordinary skill in the art to apply the numbering to the other shown components. The number of nanosheet columns shown is for illustrative purposes only and it is not meant to be seen as limiting. The number of nanosheet columns in adjacent devices can be more than, less than, or equal to five columns as illustrated by FIG. 2. The second nanodevice ND2 can have a same, different, or similar structure as the first nanodevice ND1 as illustrated by FIG. 2.

The substrate 305 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 305 includes both semiconductor materials and dielectric materials. The semiconductor substrate 305 may also comprise an organic semiconductor or a layered semiconductor such as, for example, Si/SiGe, a silicon-on-insulator or a SiGe-on-insulator. A portion or entire semiconductor substrate 305 may also be comprised of an amorphous, polycrystalline, or monocrystalline. The semiconductor substrate 305 may be doped, undoped or contain doped regions and undoped regions therein.

The first source/drain 312 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

The gate liner 308 can be comprised of, for example, a gate dielectric liner, such as high-k dielectric like $HfO_2$, $ZrO_2$, $HfL_aO_x$, etc. The gate 309 can be comprised of, for example, high-k metal gate, such as TiN, TiAlC, TiC, etc., and conductive metal fills, like W. The gate cap 319 can be, for example, a SAC cap. The first dielectric layer 315 can be, for example, an interlayered dielectric. The illustrated structure of the first nanodevice ND1 includes a bottom dielectric layer 307, but this layer is not essential. If the bottom dielectric layer 307 is not present, then the device ND1 would be directly in contact with a top surface of the substrate 305.

Figure 3:
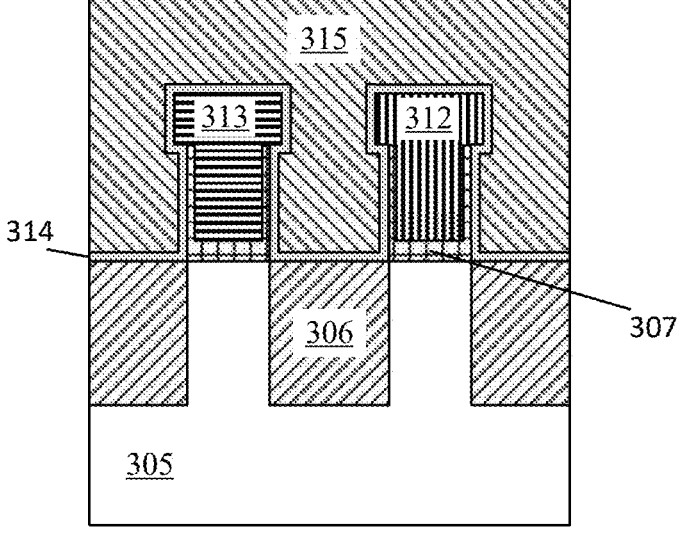
FIG. 3 illustrates cross-section Y of the adjacent devices, in accordance with the embodiment of the present invention.

FIG. 3 illustrates cross-section Y of the adjacent devices, in accordance with the embodiment of the present invention. Cross-section Y illustrates the first source/drain 312 of the first nanodevice ND1, the second source/drain 313 of the second nanodevice ND2, a shallow trench isolation layer 306, the bottom dielectric layer 307, the etch stop liner 314, and a first dielectric layer 315. The second source/drain 313 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques. The first source/drain 312 and the second source/drain 313 can exhibit a wider top section because of overfill during the formation process. The bottom dielectric layer 307 can exhibit residual material along the sidewalls of the fins before epitaxially growing the first source/drain 312 and the second source/drain 313. Hence, the bottom portion of the first source/drain 312 and the bottom portion of the second source/drain 313 can be confined by the residual dielectric sidewalls. The top portion of the first source/drain 312 and the top portion of the second source/drain 313 is not confined and can expend past the edge of the nano stack Fin. The etch stop liner 314 is located on top of the shallow trench isolation layer 306, and on three sides of each the first source/drain 312 and the second source/drain 313.

Figure 4:
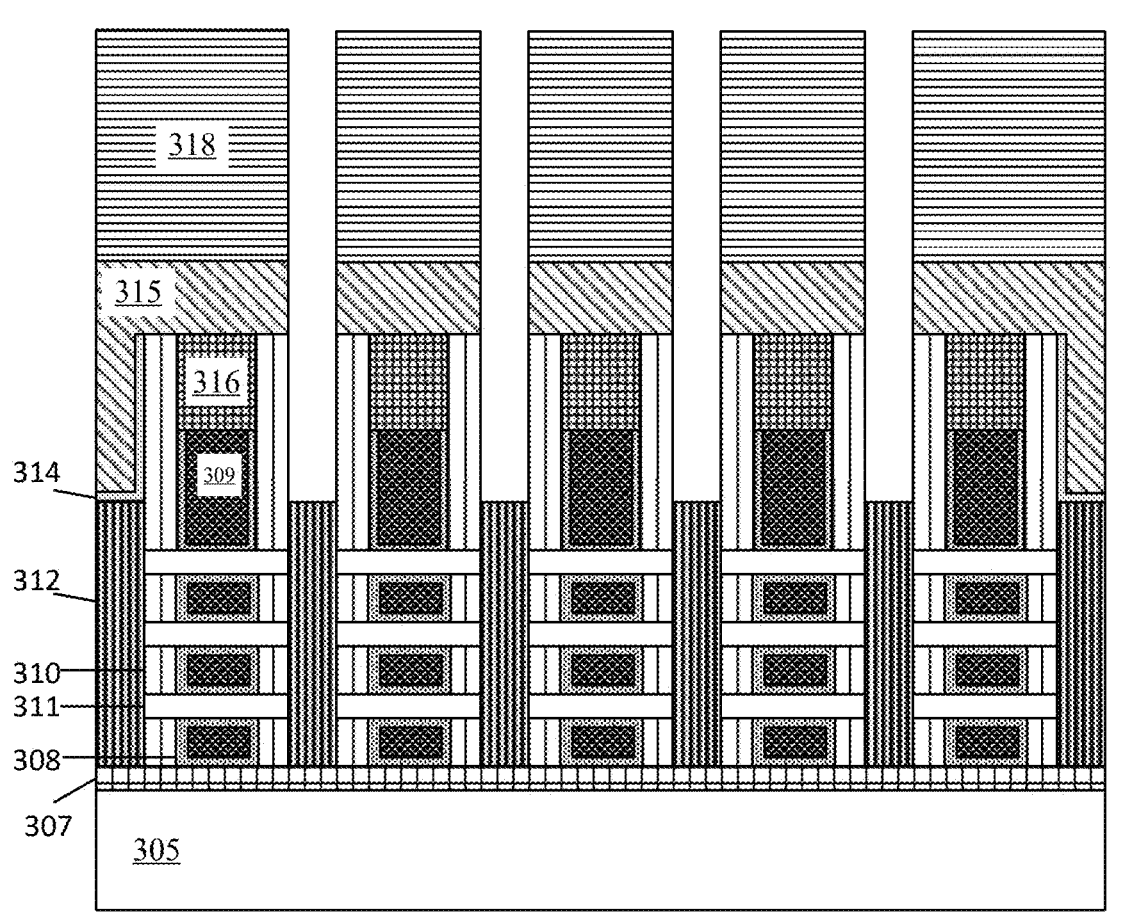
FIG. 4 illustrates cross-section X of the adjacent devices after formation of a contact trench, in accordance with the embodiment of the present invention.

FIG. 4 illustrates cross-section X of the adjacent devices after formation of a contact trench 320, in accordance with the embodiment of the present invention. A first lithography layer 318 is located on top of the first dielectric layer 315. The first lithography layer 318 is patterned and the first dielectric layer 315 is etched according to the pattern to form the contact trench 320. A top surface of the first source/drain 312 is exposed. A portion of the etch stop liner 314 is etched in where the first dielectric layer 315 is etched.

Figure 5:
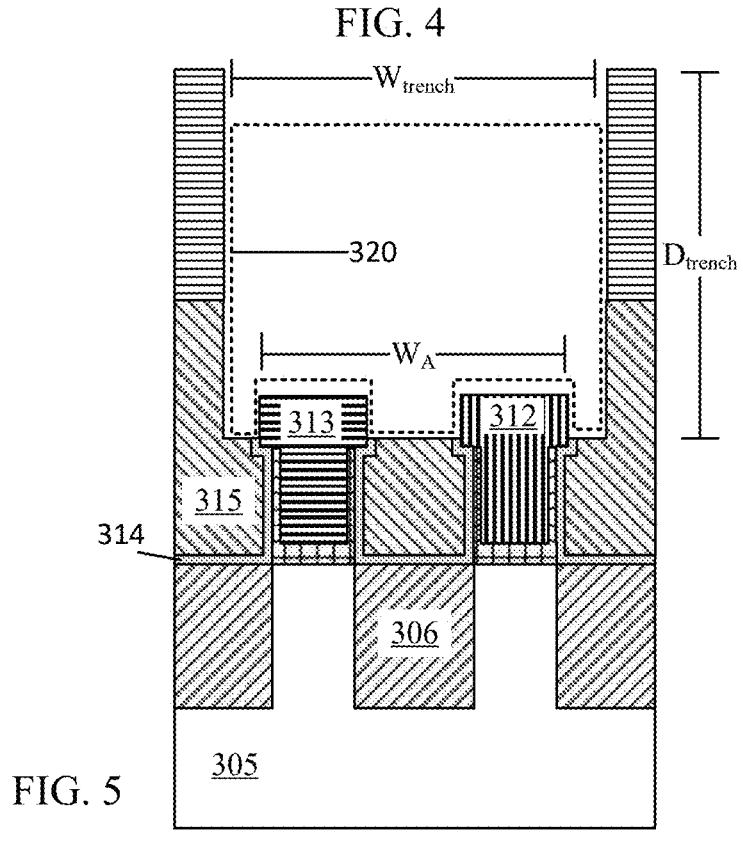
FIG. 5 illustrates cross-section Y of the adjacent devices after formation of a contact trench, in accordance with the embodiment of the present invention.

FIG. 5 illustrates cross-section Y of the adjacent devices after formation of a contact trench 320, in accordance with the embodiment of the present invention. A first lithography layer 318 is located on top of the first dielectric layer 315. The first lithography layer 318 is patterned and the first dielectric layer 315 is etched to form the contact trench 320. The contact trench 320 as illustrated by FIG. 5 exposes at least three surfaces (e.g., a top and two sides) of each the first source/drain 312 and the second source/drain 313. The contact trench 320 has a width $W_{trench}$ and a depth $D_{trench}$. The width $W_{trench}$ can be larger than the width $W_A$, where $W_A$ is the distance between the farthest sidewall of each of the first source/drain 312 and the second source/drain 313, respectively. Alternatively, the width $W_{trench}$ can be substantially equal to width $W_A$, so that the contact trench 320 only exposes a portion of one sidewall on each the first source/drain 312 and the second source/drain 313, respectively. The depth $D_{trench}$ of the contact trench 320 is enough to expose portions of the sidewalls of the first source/drain 312 and the second source/drain 313. The depth $D_{trench}$ exposes a portion of the first source/drain 312 and the second source/drain 313, while the rest of the first source/drain 312 and the second source/drain 313 remain enclosed by the first dielectric layer 315.

Figure 6:
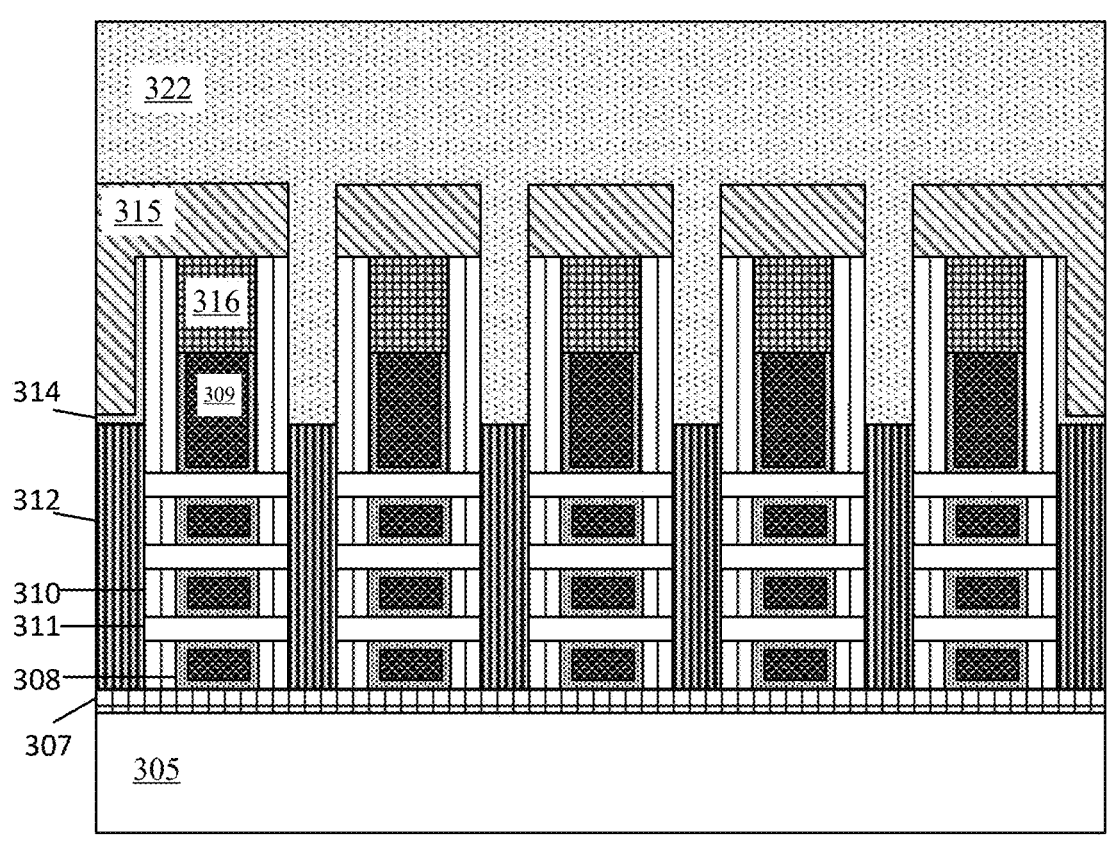
FIG. 6 illustrates cross-section X of the adjacent devices after formation of a combined contact, in accordance with the embodiment of the present invention.
Figure 7:
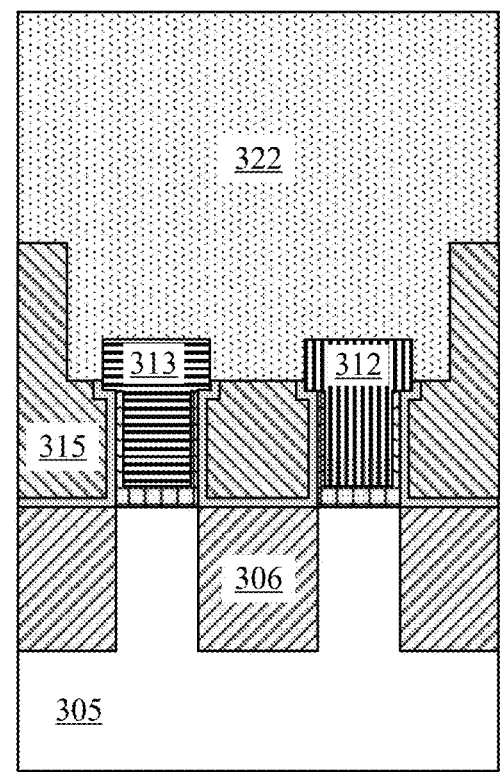
FIG. 7 illustrates cross-section Y of the adjacent devices after formation of a combined contact, in accordance with the embodiment of the present invention.

FIG. 6 illustrates cross-section X of the adjacent devices after formation of a combined contact 322, in accordance with the embodiment of the present invention. FIG. 7 illustrates cross-section Y of the adjacent devices after formation of a combined contact 322, in accordance with the embodiment of the present invention. A combined contact 322 fills the contact trench 320 and overflows on top of the first dielectric layer 315. The combined contact 322 can be comprised of, for example, a conductive metal, such as, W, Ru, an alloy, etc. A conductive liner (not shown) can be deposited before depositing the formation of the combined contact 322. The conductive liner can be, for example, Ti or TiN or both Ti/TiN liners. The conductive liner can have a thickness in the range of about 1 to 5 nm. The conductive liner can also be used to form a silicide layer on the outer surfaces of first source/drain 312 and the second source/drain 313 to improve the contact resistance. The conductive liner can also act as diffusion barriers for the combined contact 322 depending on the metal used.

Figure 8:
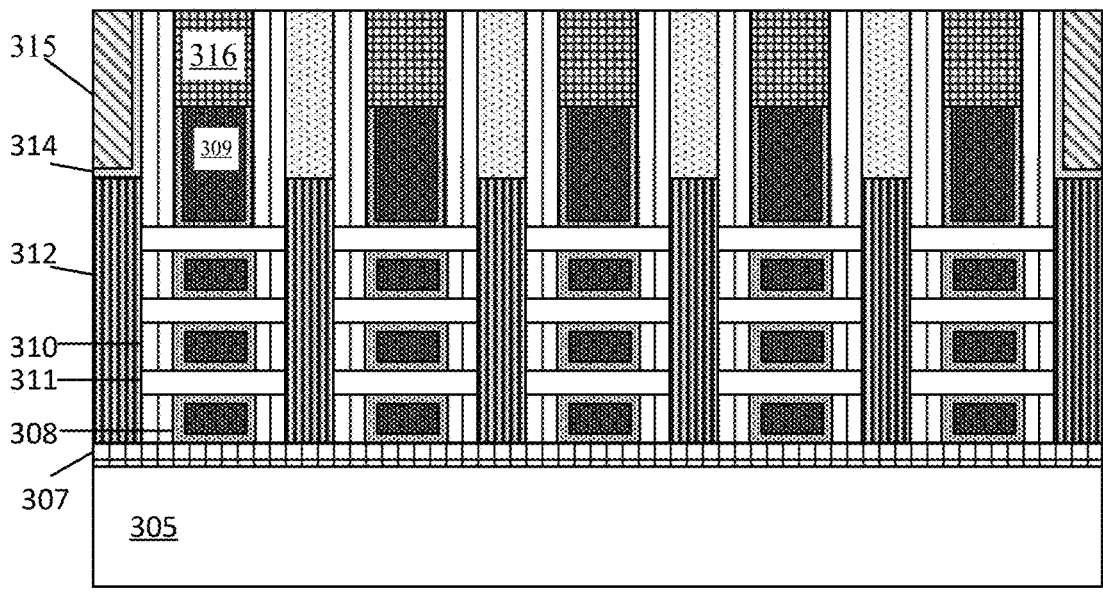
FIG. 8 illustrates cross-section X of the adjacent devices after planarizing the combined contact, in accordance with the embodiment of the present invention.
Figure 9:
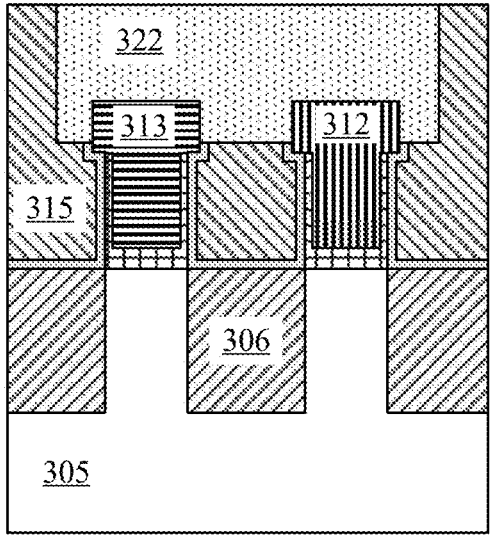
FIG. 9 illustrates cross-section Y of the adjacent devices after planarizing the combined contact, in accordance with the embodiment of the present invention.

FIG. 8 illustrates cross-section X of the adjacent devices after planarizing the combined contact 322, in accordance with the embodiment of the present invention. FIG. 9 illustrates cross-section Y of the adjacent devices after planarizing the combined contact 322, in accordance with the embodiment of the present invention. The combined contact 322 is planarized to remove overflow material. The combined contact 322 is planarized such that the top surface of the combined contact 322 is uniform with a top surface of the first dielectric layer 315.

Figure 10:
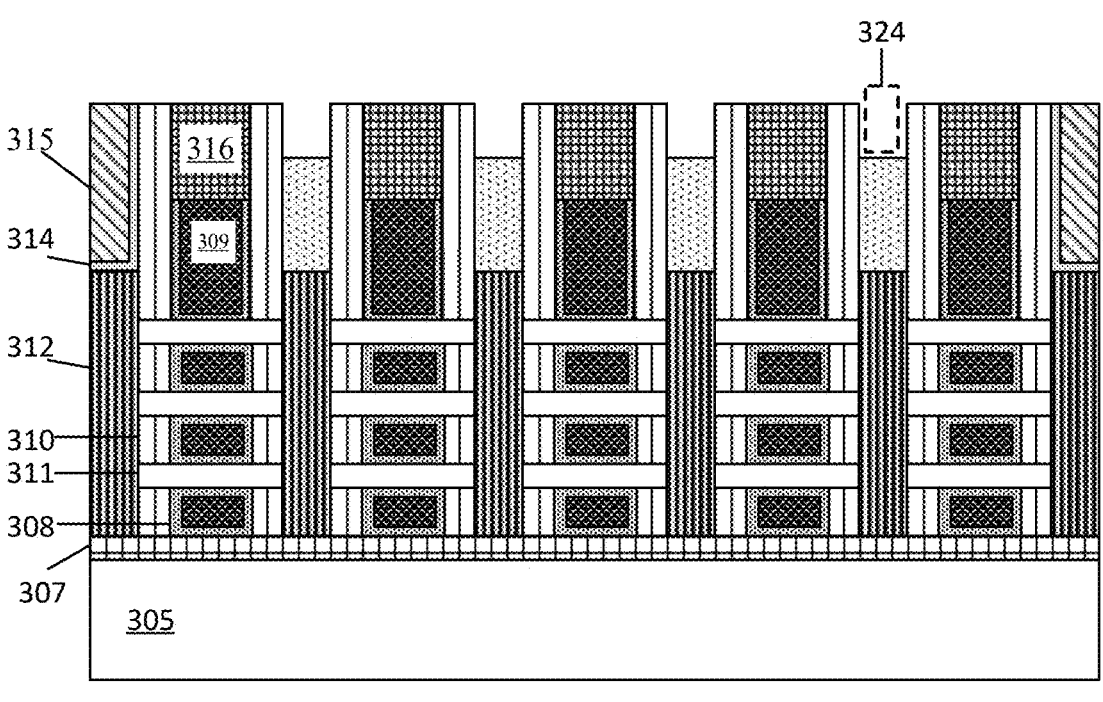
FIG. 10 illustrates cross-section X of the adjacent devices after recessing the combined contact, in accordance with the embodiment of the present invention.
Figure 11:
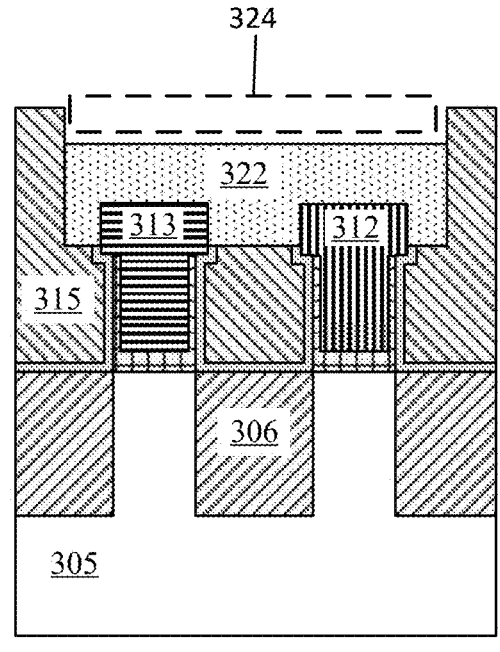
FIG. 11 illustrates cross-section Y of the adjacent devices after recessing the combined contact, in accordance with the embodiment of the present invention.

FIG. 10 illustrates cross-section X of the adjacent devices after recessing the combined contact 322, in accordance with the embodiment of the present invention. FIG. 11 illustrates cross-section Y of the adjacent devices after recessing the combined contact 322, in accordance with the embodiment of the present invention. The combined contact 322 is etched back to forming a contact cap trench 324.

Figure 12:
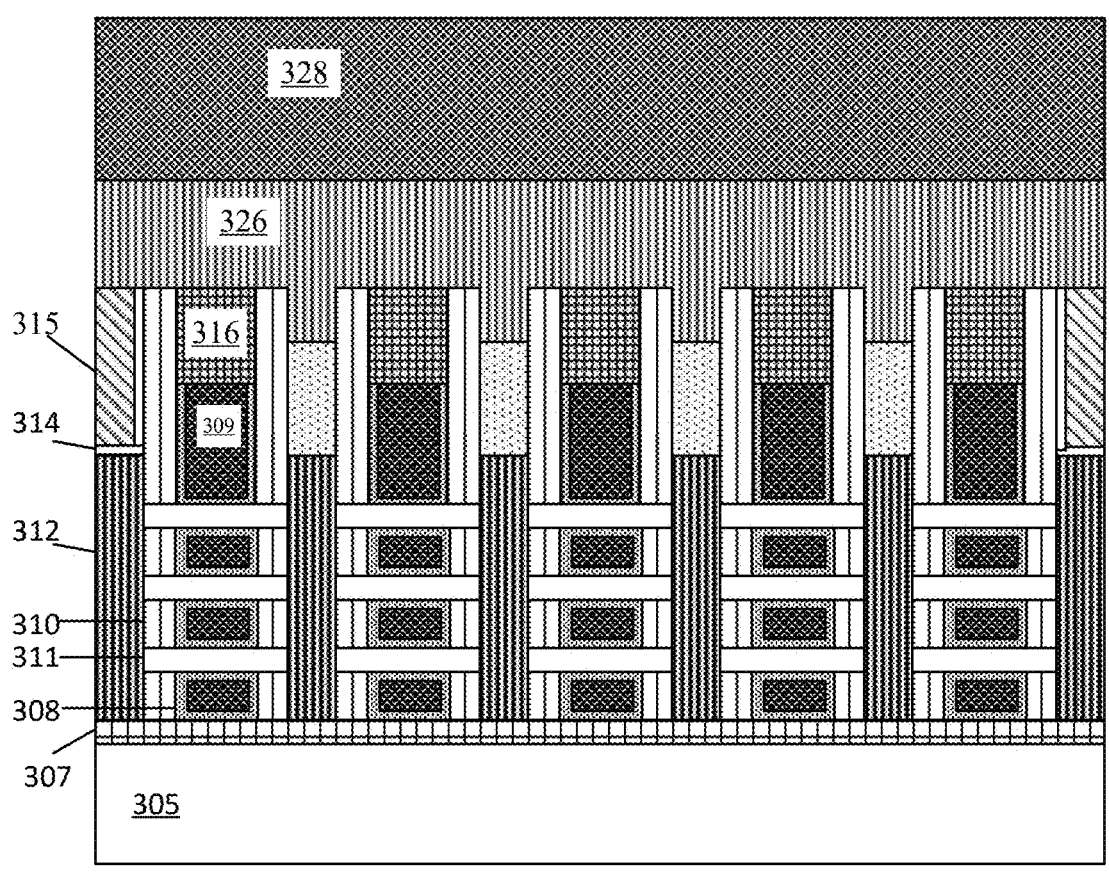
FIG. 12 illustrates cross-section X of the adjacent devices after formation of a second lithography layer and a patterning layer, in accordance with the embodiment of the present invention.

FIG. 12 illustrates cross-section X of the adjacent devices after formation of a second lithography layer 326 and a patterning layer 328, in accordance with the embodiment of the present invention. A second lithography layer 326 is formed on the exposed surfaces and fills the contact cap trench 324. A patterning layer 328 is formed on top of the second lithography layer 326.

Figure 13:
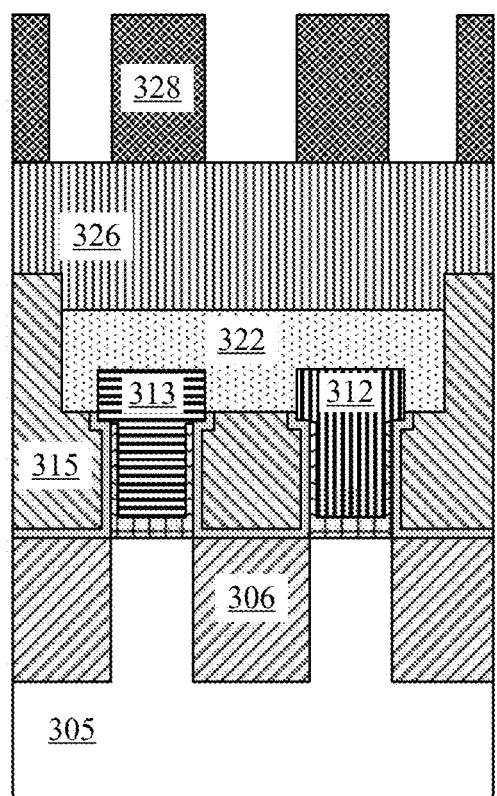
FIG. 13 illustrates cross-section Y of the adjacent devices after formation of a second lithography layer and a patterning layer, in accordance with the embodiment of the present invention.

FIG. 13 illustrates cross-section Y of the adjacent devices after formation of a second lithography layer 326 and a patterning layer 328, in accordance with the embodiment of the present invention. A second lithography layer 326 is formed on the exposed surfaces and fills the contact cap trench 324. A patterning layer 328 is formed on top of the second lithography layer 326. The patterning layer 328 is patterned as illustrated by FIG. 13. This pattern will be transferred to the second lithography layer 326 for etching of the combine contact 322, which will be described in detail below.

Figure 14:
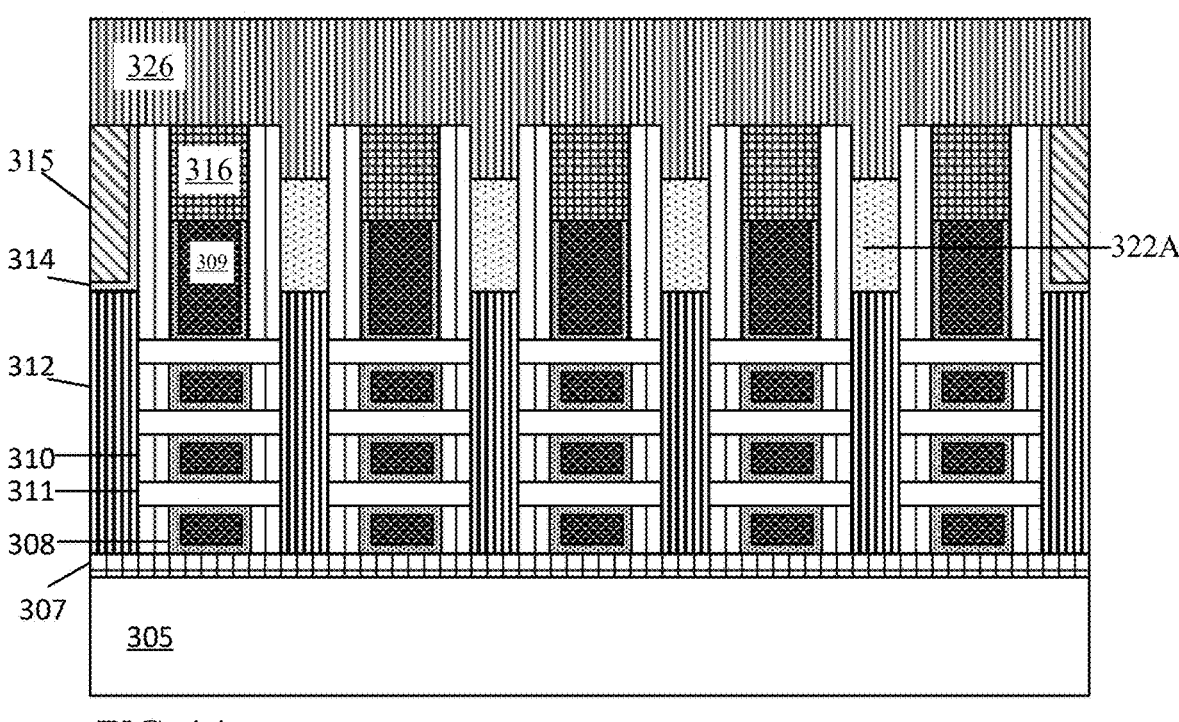
FIG. 14 illustrates cross-section X of the adjacent devices after formation of a separating trench, in accordance with the embodiment of the present invention.
Figure 15:
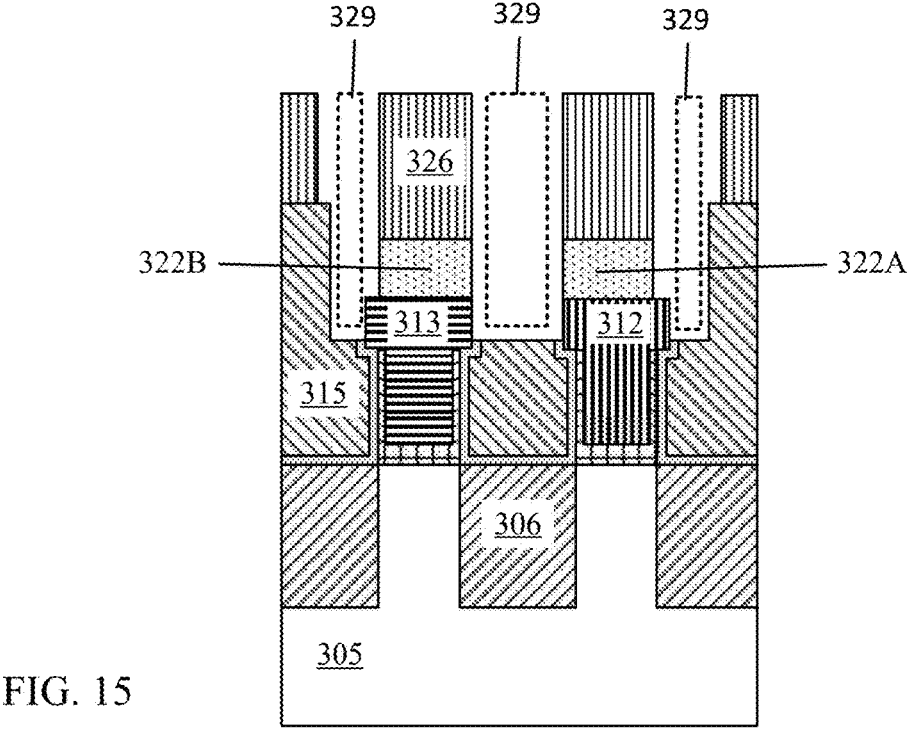
FIG. 15 illustrates cross-section Y of the adjacent devices after formation of a separating trench, in accordance with the embodiment of the present invention.

FIG. 14 illustrates cross-section X of the adjacent devices after formation of a separating trench 329, in accordance with the embodiment of the present invention. FIG. 15 illustrates cross-section Y of the adjacent devices after formation of a separating trench 329, in accordance with the embodiment of the present invention. The pattern is transferred to the second lithography layer 326 and the pattern is etched into the combined contact 322. The etching process forms separating trenches 329 in the combined contact 322, thus the combined contact 322 is separated into a first contact 322A and a second contact 322B. The separating trenches 329 extend downwards far enough to expose a portion of the sidewalls of the first source/drain 312 and a portion of the sidewalls of the second source/drain 313. Alternatively, the width of the separating trench 329 can be such that sidewalls of the first source/drain 312 and the sidewalls of the second source/drain 313 are not exposed (not shown). FIG. 15 illustrates three separating trenches 329 were formed but this is for illustrative purposes only. The key separating trench 329 that needs to be formed is the trench located between the first source/drain 312 and the second source/drain 313. This is the separating trench 329 that divides the combined contact 322 into the first contact 322A and the second contact 322B. The first contact 322A and the second contact 322B are located on top of the first source/drain 312 and the second source/drain 313, respectively.

Figure 16:
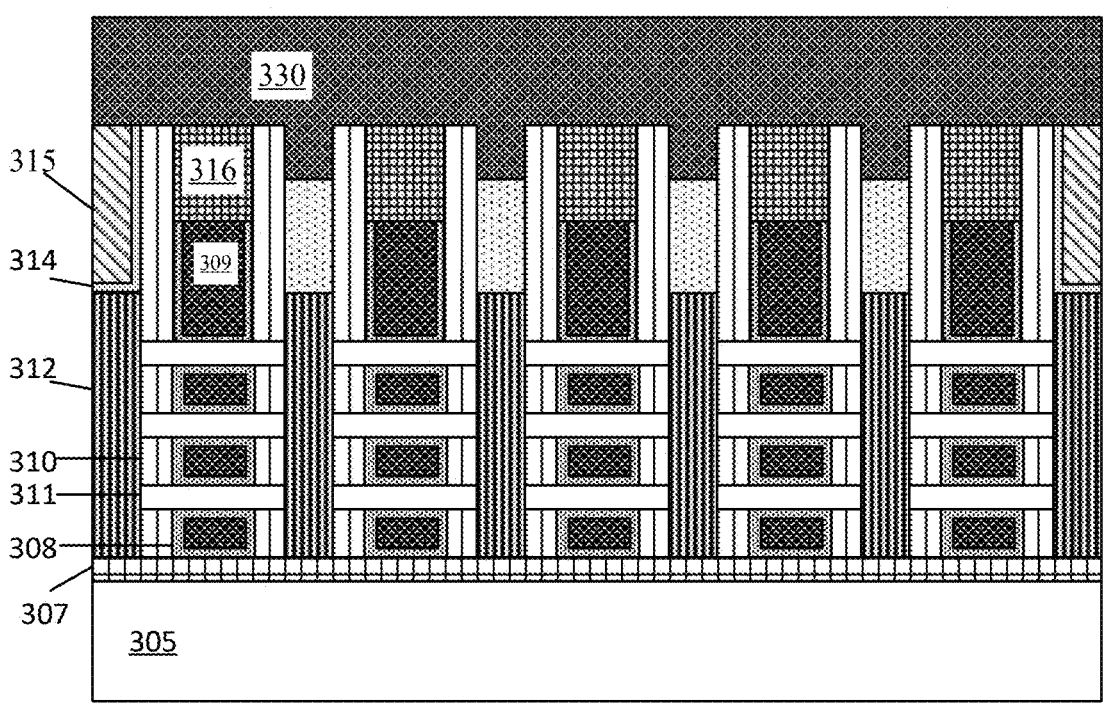
FIG. 16 illustrates cross-section X of the adjacent devices after formation of a contact cap, in accordance with the embodiment of the present invention.

FIG. 16 illustrates cross-section X of the adjacent devices after formation of a contact cap 330, in accordance with the embodiment of the present invention. The second lithography layer 326 is removed and a contact cap 330 is formed on top of the exposed surfaces. The contact cap 330 fills the contact cap trench 324 that was exposed by the removal of the second lithography layer 326. The contact cap 330 is comprised of, for example, a dielectric material such as Silicon Carbide (SiC) or Aluminum Oxide (AlOx). The gate cap 316 can be comprised of the same material as the contact cap 330. Alternatively, the gate cap 316 can be comprised of a different material as the contact cap 330 to allow for the different caps to be selectively etched.

Figure 17:
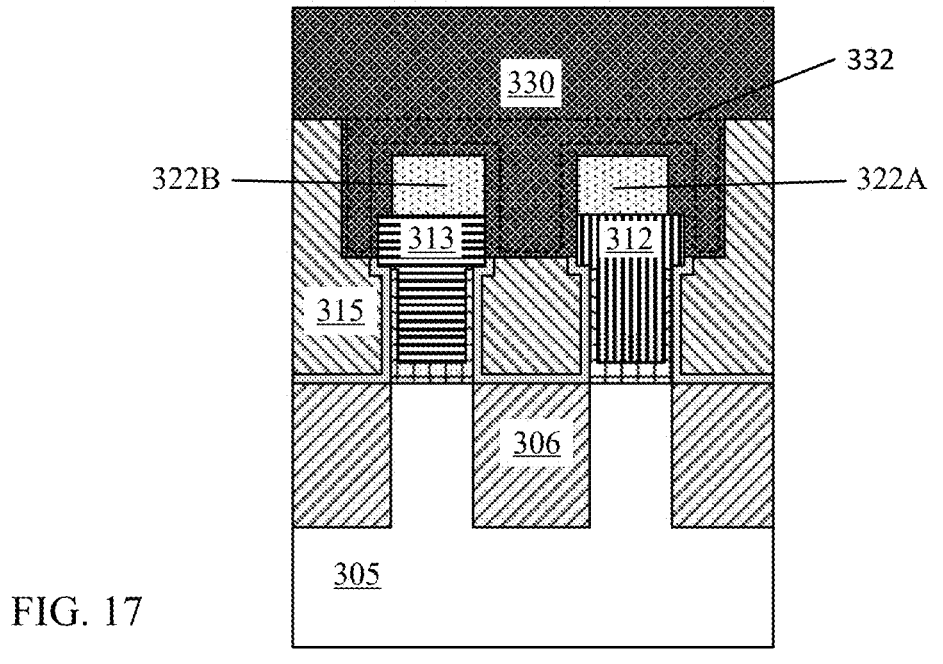
FIG. 17 illustrates cross-section Y of the adjacent devices after formation of a contact cap, in accordance with the embodiment of the present invention.

FIG. 17 illustrates cross-section Y of the adjacent devices after formation of a contact cap 330, in accordance with the embodiment of the present invention. The second lithography layer 326 is removed and a contact cap 330 is formed around the exposed surfaces of the first source/drain, the first contact 322A, the second source/drain 313, and the second contact 322B. The contact cap 330 forms a M-shape, as illustrated by dashed box 332 around first source/drain, the first contact 322A, the second source/drain 313, and the second contact 322B. The right leg of the contact cap 330, as illustrated by FIG. 17, is in direct contact with the first source/drain 312, the first contact 322A, and a sidewall of the first dielectric 215. The left leg of the contact cap 330, as illustrated by FIG. 17, is in direct contact with the second source/drain 313, the second contact 322B, and a sidewall of the first dielectric 215. The center leg of the contact cap 330, as illustrated by FIG. 17, is in direct contact with first source/drain 312, the second source/drain 313, the first contact 322A, the second contact 322B, and the first dielectric layer 315. The contact cap 330 is also directly in contact with a top surface of the first contact 322A and the second contact 322B.

Figure 18:
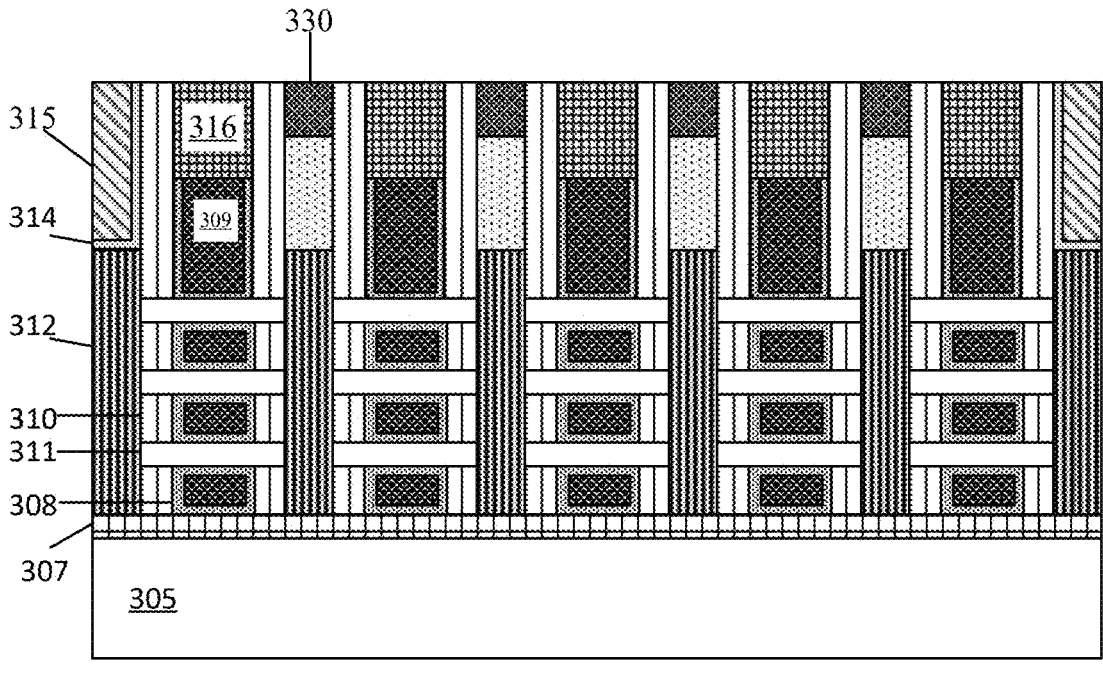
FIG. 18 illustrates cross-section X of the adjacent devices after planarizing the contact cap, in accordance with the embodiment of the present invention.
Figure 19:
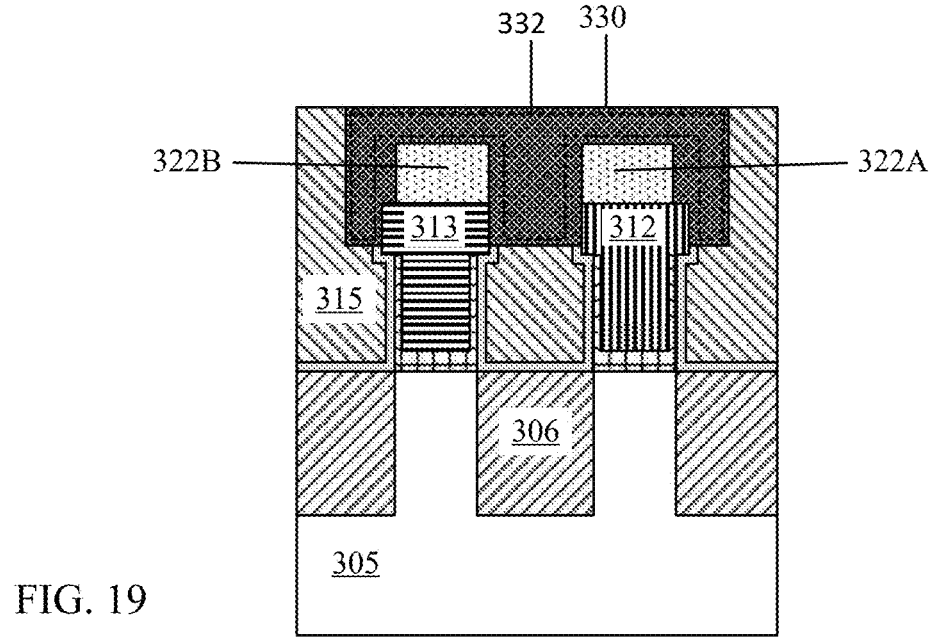
FIG. 19 illustrates cross-section Y of the adjacent devices after planarizing the contact cap, in accordance with the embodiment of the present invention.

FIG. 18 illustrates cross-section X of the adjacent devices after planarizing the contact cap 330, in accordance with the embodiment of the present invention. FIG. 19 illustrates cross-section Y of the adjacent devices after planarizing the contact cap 330, in accordance with the embodiment of the present invention. The contact cap 330 is planarized to remove excess contact cap 330 material and to create a uniform surface as illustrated by FIGS. 18 and 19.

Figure 20:
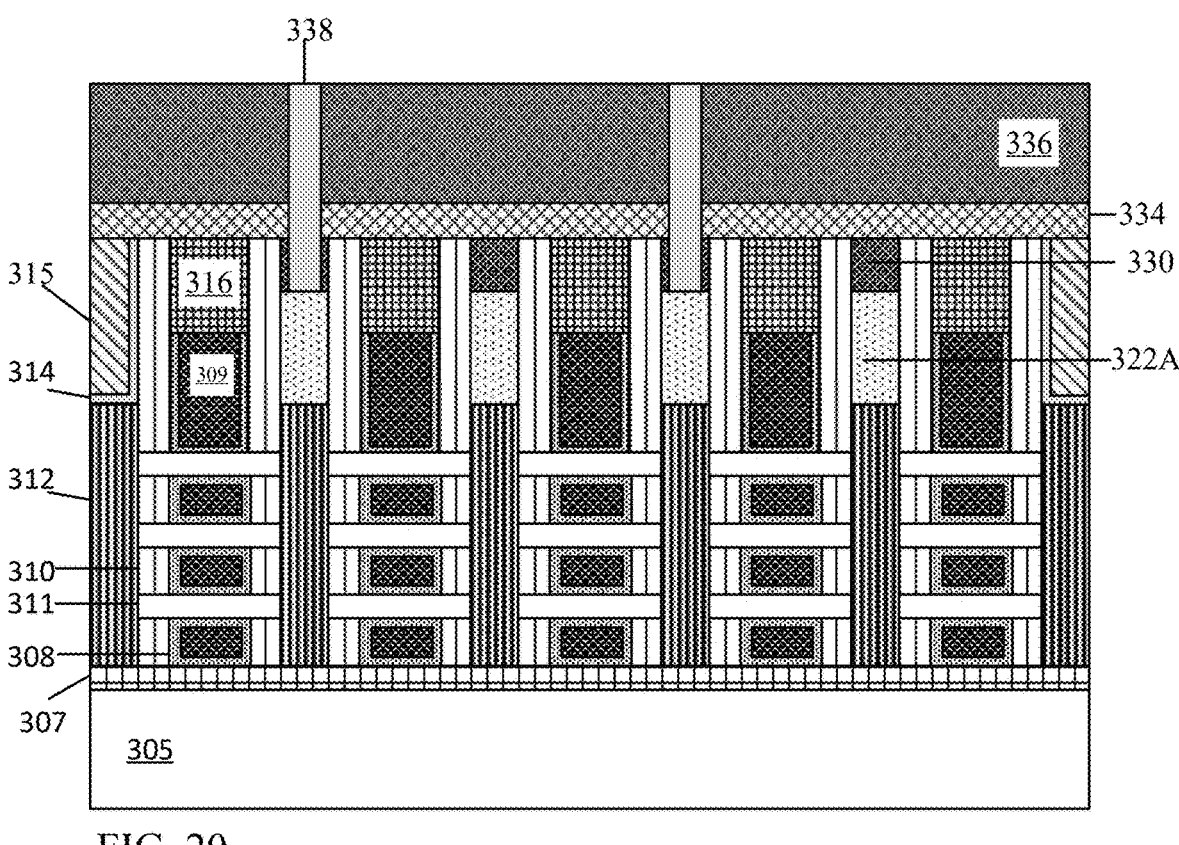
FIG. 20 illustrates cross-section X of the adjacent devices after forming connections to the first contact, in accordance with the embodiment of the present invention.

FIG. 20 illustrates cross-section X of the adjacent devices after forming connections to the first contact 322A, in accordance with the embodiment of the present invention. A second dielectric layer 334 is formed on top of the exposed surfaces as illustrated by FIG. 20. The second dielectric layer 334 can be comprised of, for example, SiN. A top layer 336 is formed on top of the second dielectric layer 334. The top layer 336 can be comprised of, for example, $SiO_2$. A contact via 338 is formed through the top layer 336, the second dielectric layer 334, and the contact cap 330 to directly connect with the first contact 322A. After forming the contact via 338, the top surface is planarized to remove excess material and to create a uniform surface between a top surface of the contact via 338 and the top surface of the top layer 336.

Figure 21:
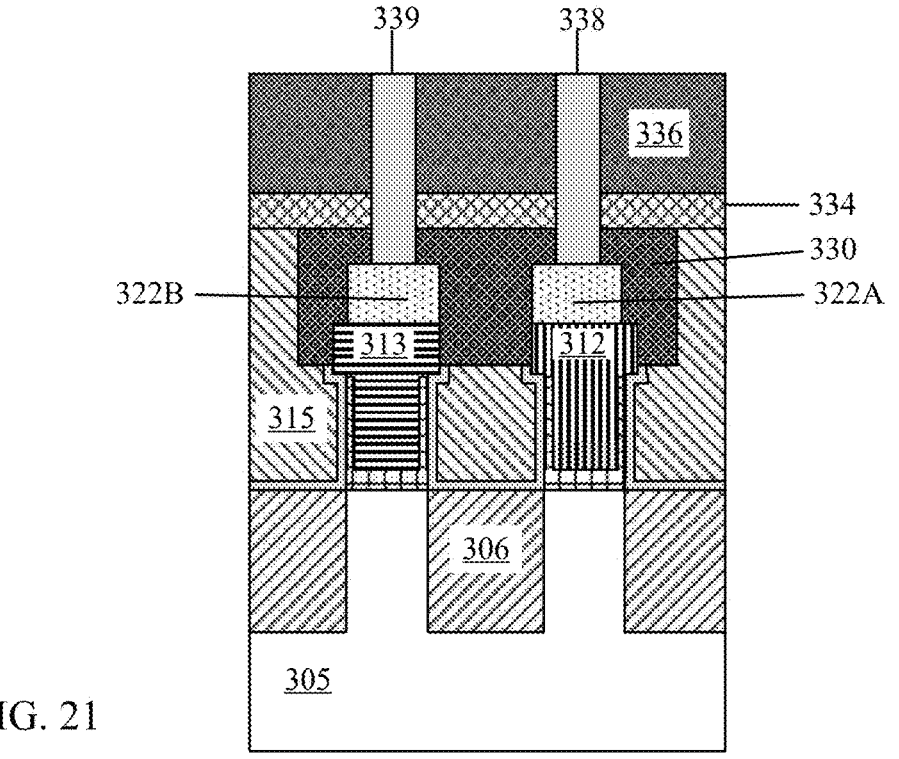
FIG. 21 illustrates cross-section Y of the adjacent devices after forming connections to the first contact and second contact, in accordance with the embodiment of the present invention.

FIG. 21 illustrates cross-section Y of the adjacent devices after forming connections to the first contact 322A and second contact 322B, in accordance with the embodiment of the present invention. A second dielectric layer 334 is formed on top of the exposed surfaces of the contact cap 330 and the first dielectric layer 315. The second dielectric layer 334 can be comprised of, for example, SiN. A top layer 336 is formed on top of the second dielectric layer 334. The top layer 336 can be comprised of, for example, SiO2. A contact via 338 is formed through the top layer 336, the second dielectric layer 334, and the contact cap 330 to directly connect with the first contact 322A. Another contact via 339 is formed through the top layer 336, the second dielectric layer 334, and the contact cap 330 to directly connect with the second contact 322B. After forming the contact via 338 and another contact via 339, the top surface is planarized to remove excess material and to create a uniform surface between a top surface of the contact via 338 and the top surface of the top layer 336.

The etch of the contact cap 330 is selective to the gate cap 316. Hence, a gate contact (not shown) can be selectively formed and self-aligned to the gate spacer (not shown) and contact cap 330 over the active device region if needed. The Source-Drain contacts 338, 339 can be selectively formed and self-aligned to the gate spacer and gate cap 316.

Figure 22:
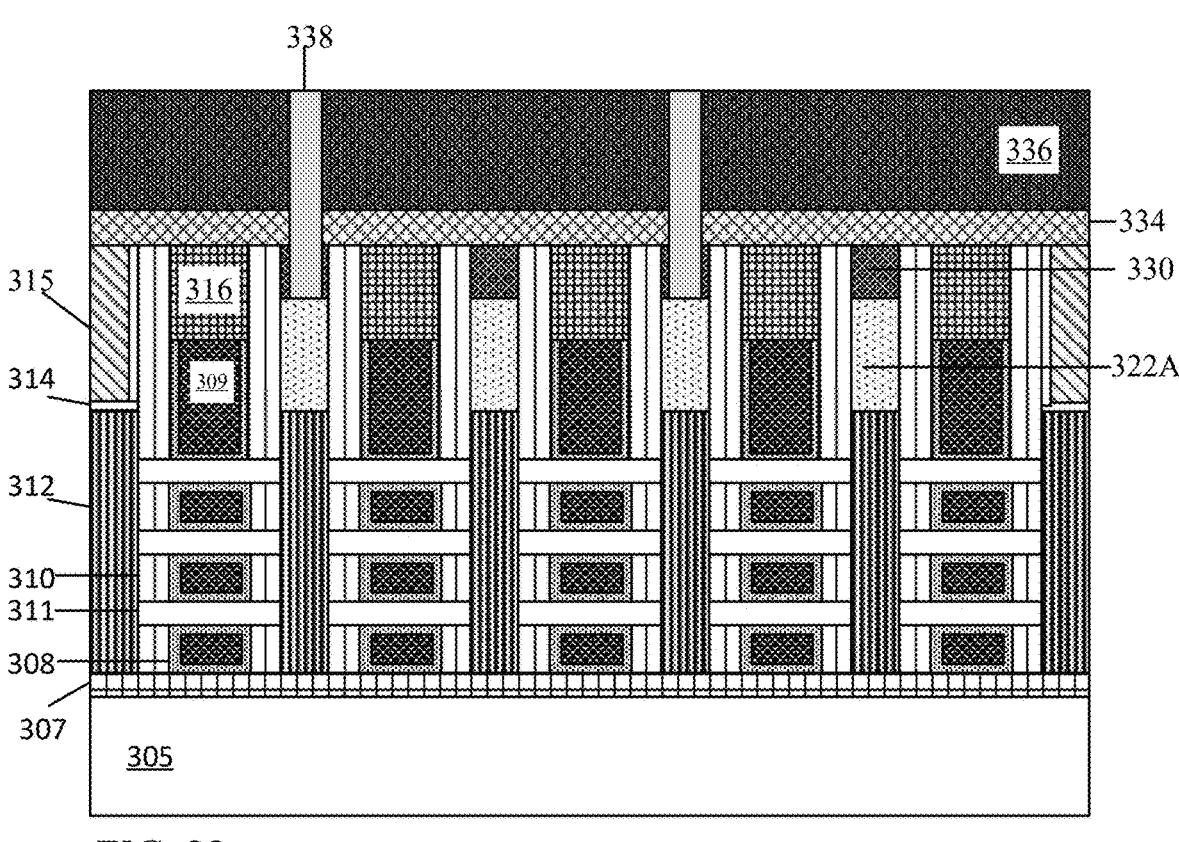
FIG. 22 illustrates cross-section X of the adjacent devices after forming connections to the first contact, in accordance with the embodiment of the present invention.
Figure 23:
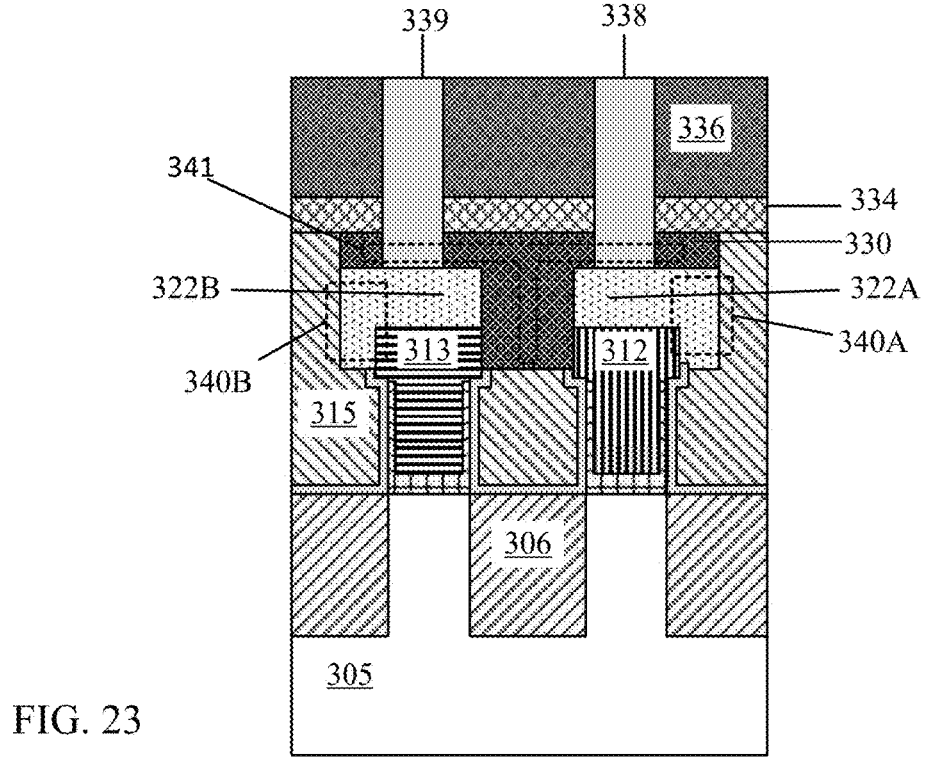
FIG. 23 illustrates cross-section Y of the adjacent devices after forming connections to the first contact and second contact, in accordance with the embodiment of the present invention.

FIG. 22 illustrates cross-section X of the adjacent devices after forming connections to the first contact 322A, in accordance with the embodiment of the present invention. FIG. 23 illustrates cross-section Y of the adjacent devices after forming connections to the first contact 322A and second contact 322B, in accordance with the embodiment of the present invention. A second dielectric layer 334 is formed on top of the exposed surfaces of the contact cap 330T and the first dielectric layer 315. The second dielectric layer 334 can be comprised of, for example, SiN. A top layer 336 is formed on top of the second dielectric layer 334. The top layer 336 can be comprised of, for example, $SiO_2$. A contact via 338 is formed through the top layer 336, the second dielectric layer 334, and the contact cap 330T to directly connect with the first contact 322A. Another contact via 339 is formed through the top layer 336, the second dielectric layer 334, and the contact cap 330T to directly connect with the second contact 322B. One difference between FIG. 23 and FIG. 21 is that the contact cap 330T is T-shaped and the contact cap 330T does not extend downwards between a sidewall of the first/second source/drain 312, 313 and the first dielectric layer 315. This T-shape can be achieved by only etching a center separating trench 329 between the first source/drain 312 and the second source/drain 312. This will allow for the first contact 322A to wrap around the first source/drain 312, so that the first contact 322A is in direct contact with two surfaces of the first source/drain 312, as illustrated by dashed box 340A. This second contact 322B will also wrap around the second source/drain 313, so that the second contact 322B is in direct contact with two surfaces of the second source/drain 313, as illustrated by dashed box 340B.

Figure 24:
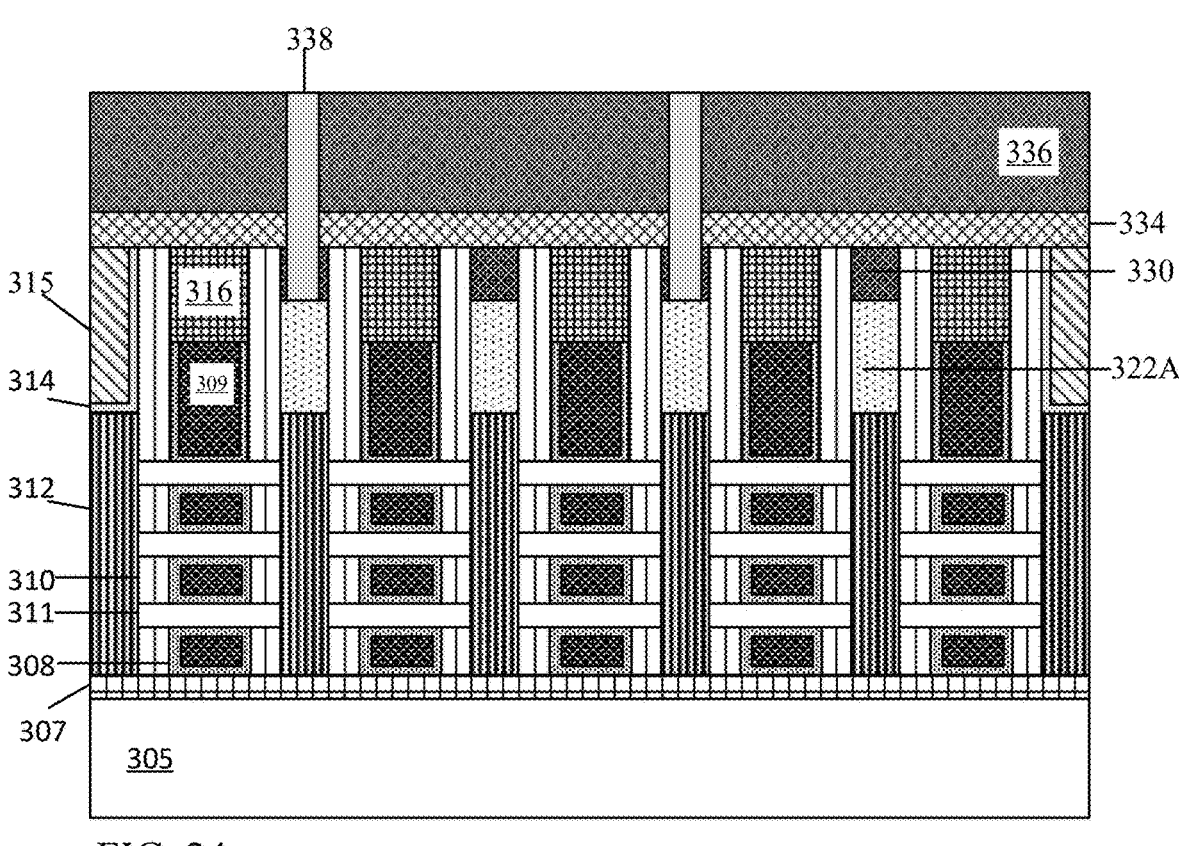
FIG. 24 illustrates cross-section X of the adjacent devices after forming connections to the first contact, in accordance with the embodiment of the present invention.
Figure 25:
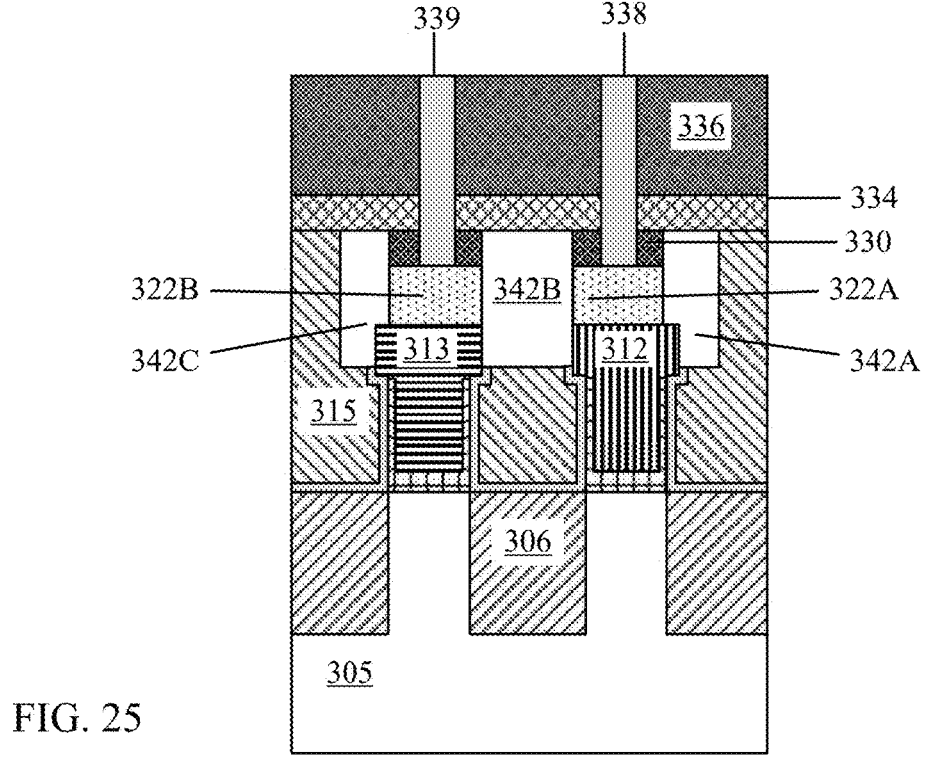
FIG. 25 illustrates cross-section Y of the adjacent devices after forming connections to the first contact and second contact, in accordance with the embodiment of the present invention.

FIG. 24 illustrates cross-section X of the adjacent devices after forming connections to the first contact 32A, in accordance with the embodiment of the present invention. FIG. 25 illustrates cross-section Y of the adjacent devices after forming connections to the first contact 322A and second contact 322B, in accordance with the embodiment of the present invention. FIG. 25 is illustrating an alternative for enclosing the first contact 322A, the second contact 322B, the first source/drain 312, and the second source/drain 313. This is accomplished by filling the separating trenches 329 with a third dielectric layer 342A, 342B, and 342C. The third dielectric layer 342A, 342B, and 342C can be comprised of, for example, a low-K dielectric. Extra dielectric material and the second lithography layer 326 is planarized to form a uniform surface along the top of the first dielectric layer 315, the third dielectric layer 342A, 342B, 342C and a top surface of the remaining second lithography layer 326. The remaining second lithography layer 326 is removed to expose the contact cap trench 324 located on top of both the first contact 322A and the second contact 322B. The sidewalls of the contact cap trench 224 will be comprised of the third dielectric layer 342A, 342B, and/or 342C. The contact cap trench 324 is filled with the contact cap 330, thus the contact cap 330 is only located on top of the first contact 322A, and the second contact 322B, respectively. The third dielectric layer 342A, 342B, and 342C comprised of a low-K dielectric material reduces a parasitic capacitance between the first contact 322A and the second contact 322B.

Figure 26:
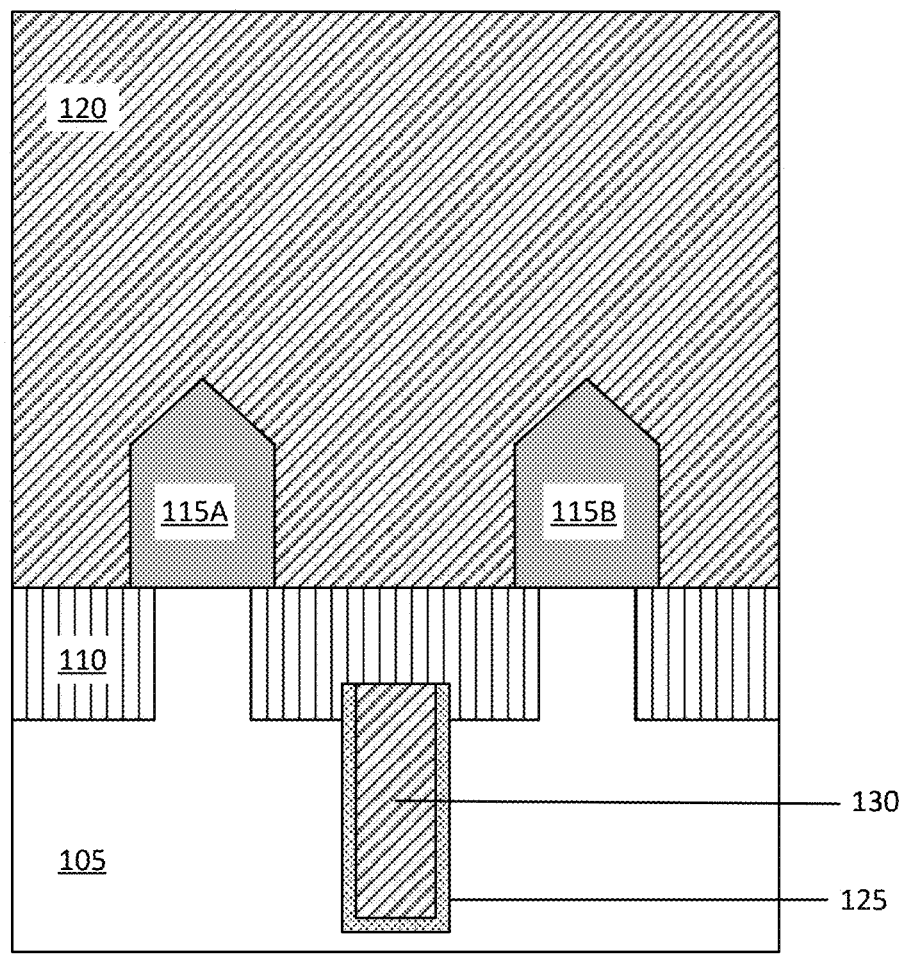
FIG. 26 illustrates a cross section of adjacent source/drains and a buried power rail, in accordance with the embodiment of the present invention.

FIG. 26 illustrates a cross section of adjacent source/drains 115A and 115B and a buried power rail 130, in accordance with the embodiment of the present invention. The nano device 100 includes a substrate 105, a shallow trench isolation layer 110, a left source/drain 115A, a right source/drain 115B, a dielectric layer 120, a power liner 125, and a buried power rail 130. The substrate 105 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or entire semiconductor substrate 105 may also be comprised of an amorphous, polycrystalline, or monocrystalline. The semiconductor substrate 105 may be doped, undoped or contain doped regions and undoped regions therein.

The left source/drain 115A and the right source/drain 115B can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques. The power liner 125 can be, for example, SiO2, Tantalum Nitride, or another suitable material. The power liner 125 is located on three sides of the buried power rail 130.

Figure 27:
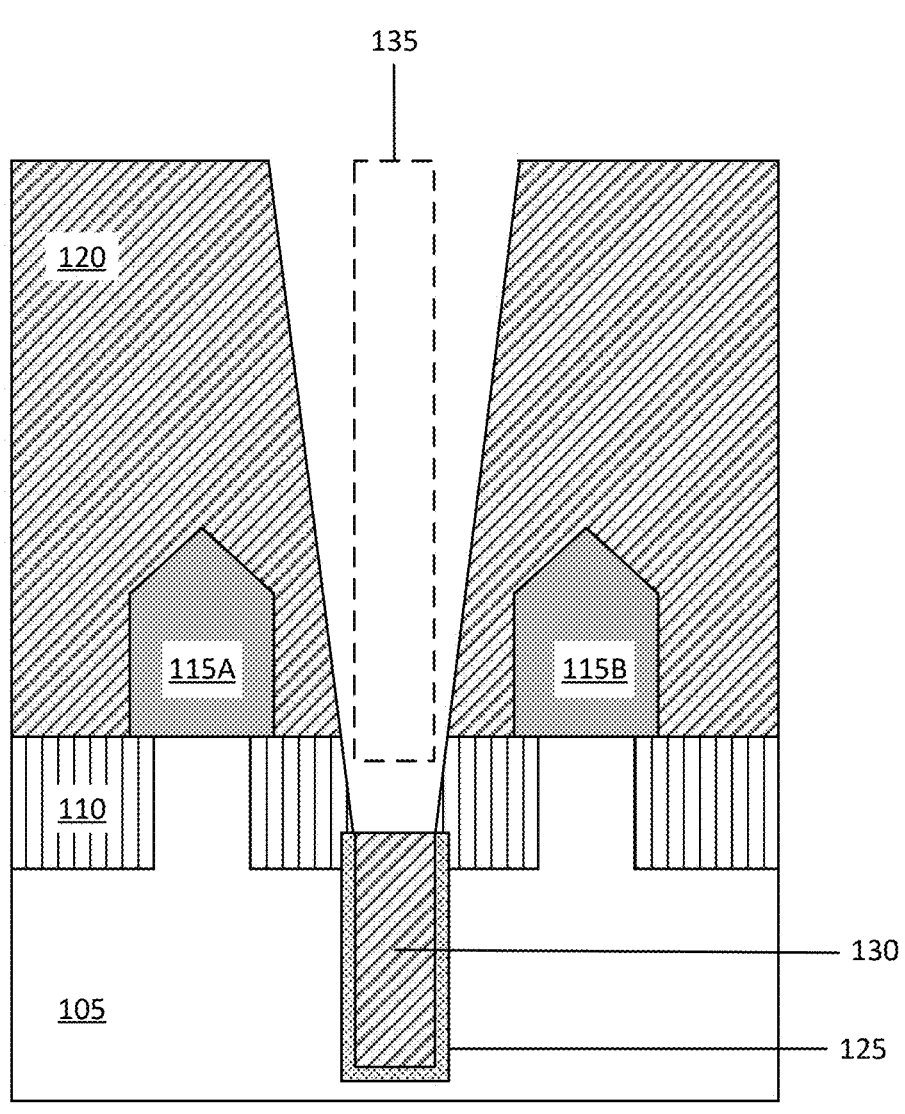
FIG. 27 illustrates a cross section of adjacent source/drains and a buried power rail after a trench is cut downwards to the buried power rail, in accordance with the embodiment of the present invention.

FIG. 27 illustrates a cross section of adjacent source/drains 115A, 115B and a buried power rail 130 after a trench 135 is etched downwards to the buried power rail 130, in accordance with the embodiment of the present invention. A trench 135 is etched in the dielectric layer 120 and the shallow trench isolation layer 110 to expose a top surface of the buried power rail 130. The trench 135 is located between the left source/drain 115A and the right source/drain 115B. The trench 135 does not expose any surfaces of either the first source/drain 115 or the right source/drain 115B. When the space between adjacent source/drains 115A, 115B is small enough the trench 135 could expose the sidewalls of one the adjacent source/drains 115A, 115B or both.

Figure 28:
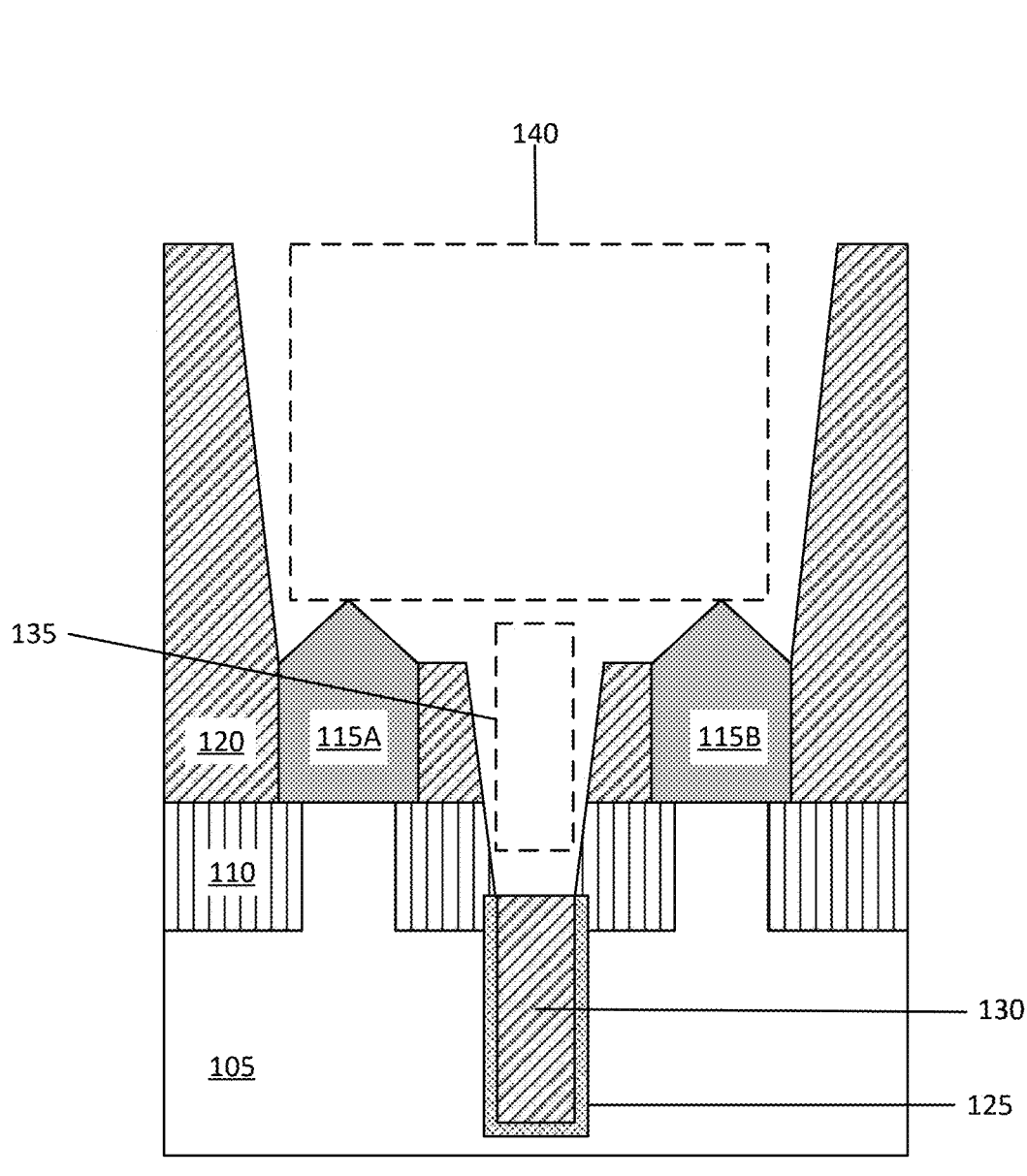
FIG. 28 illustrates a cross section of adjacent source/drains and a buried power rail after a contact trench is formed, in accordance with the embodiment of the present invention.

FIG. 28 illustrates a cross section of adjacent source/drains 115A, 115B and a buried power rail 130 after a contact trench 140 is formed, in accordance with the embodiment of the present invention. The dielectric layer 120 is etched to form a contact trench 140. The top surface of the left source/drain 115A and the top surface of the right source/drain 115B are exposed by the etching of the contact trench 140. The exposed top surface of the left source/drain 115A and the top surface of the right source/drain 115B will allow for a direct connection between the source/drains and a contact. The contact trench 140 is connected to trench 135, to allow for contact material to fill the trench 135, as described below.

Figure 29:
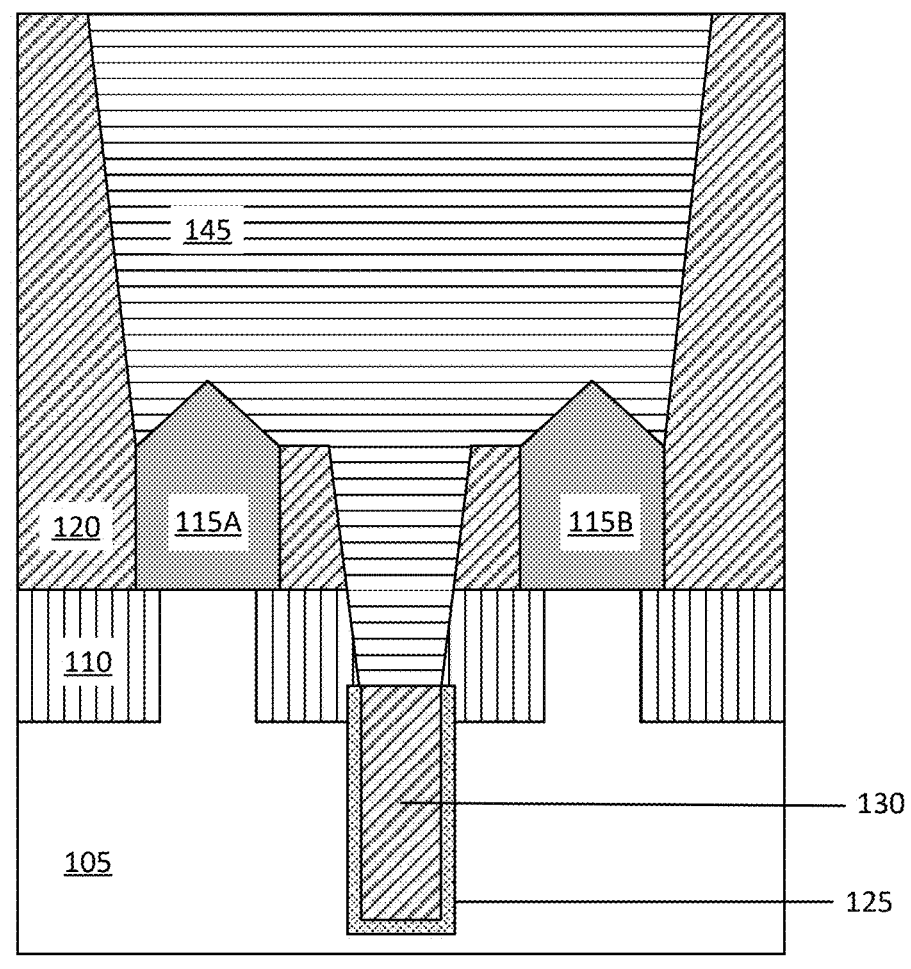
FIG. 29 illustrates a cross section of adjacent source/drains and a buried power rail after the formation of a combined contact, in accordance with the embodiment of the present invention.

FIG. 29 illustrates a cross section of adjacent source/drains 115A, 115B and a buried power rail 130 after the formation of a contact 145, in accordance with the embodiment of the present invention. A contact 145 is formed in the contact trench 140 and in trench 135. The contact 145 is in direct contact with the top surface of the buried power rail 130, the top surface of the left source/drain 115A, and the top surface of the right source/drain 115B.

Figure 30:
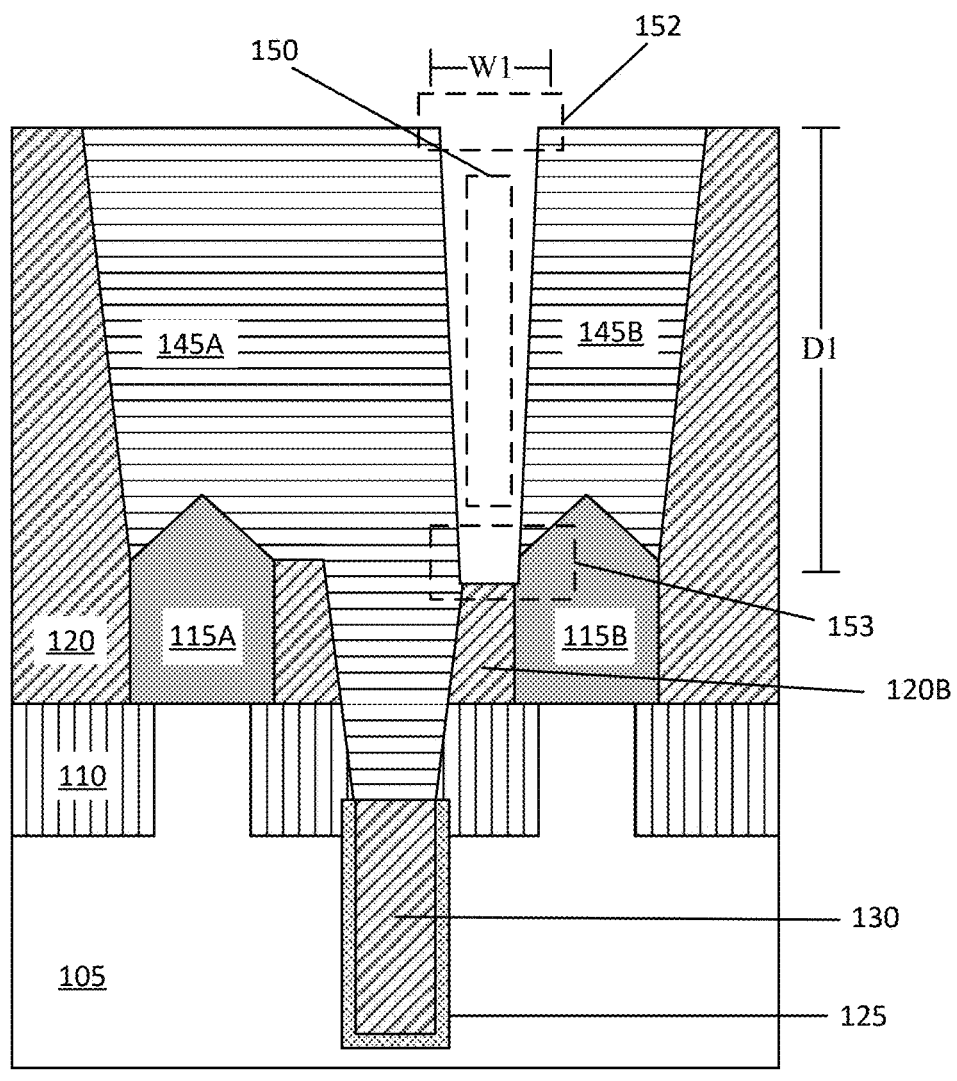
FIG. 30 illustrates a cross section of adjacent source/drains and a buried power rail after the formation of a separating trench, in accordance with the embodiment of the present invention.

FIG. 30 illustrates a cross section of adjacent source/drains 115A, 115B and a buried power rail 130 after the formation of a separating trench 150, in accordance with the embodiment of the present invention. A separating trench 150 is cut into the contact 145, thus creating a left contact 145A and a right contact 145B. The separating trench 150 has a depth D1 such that a portion 120B of the dielectric layer 120 is exposed. The separating trench 150 extends from the top of the contact 145 downwards into a section 120B of the dielectric layer 120 located adjacent to the right source/drain 115B. The depth D1 of the separating trench 150 is large enough to ensure that the left contact 145A and the right contact 145B are completely separated from each other. The separating trench 150 extends to a depth D1 that exposes a sidewall of the right source/drain 115B and a portion of the via of the left contact 145A that extends downwards to the buried power rail 130. The top opening 152 of the separating trench 150 has a width W1. The width W1 is large enough to allow enough dielectric material to be deposited there to prevent the shorting of the left contact 145A and the right contact 145B. As illustrated, the separating trench 150 exposes a side portion of the right source/drain 115B, but that is not necessary if the width W1 is small enough not to expose the sidewall but to still allow enough dielectric material to be deposited there to prevent the shorting of the left contact 145A and the right contact 145B.

Figure 31:
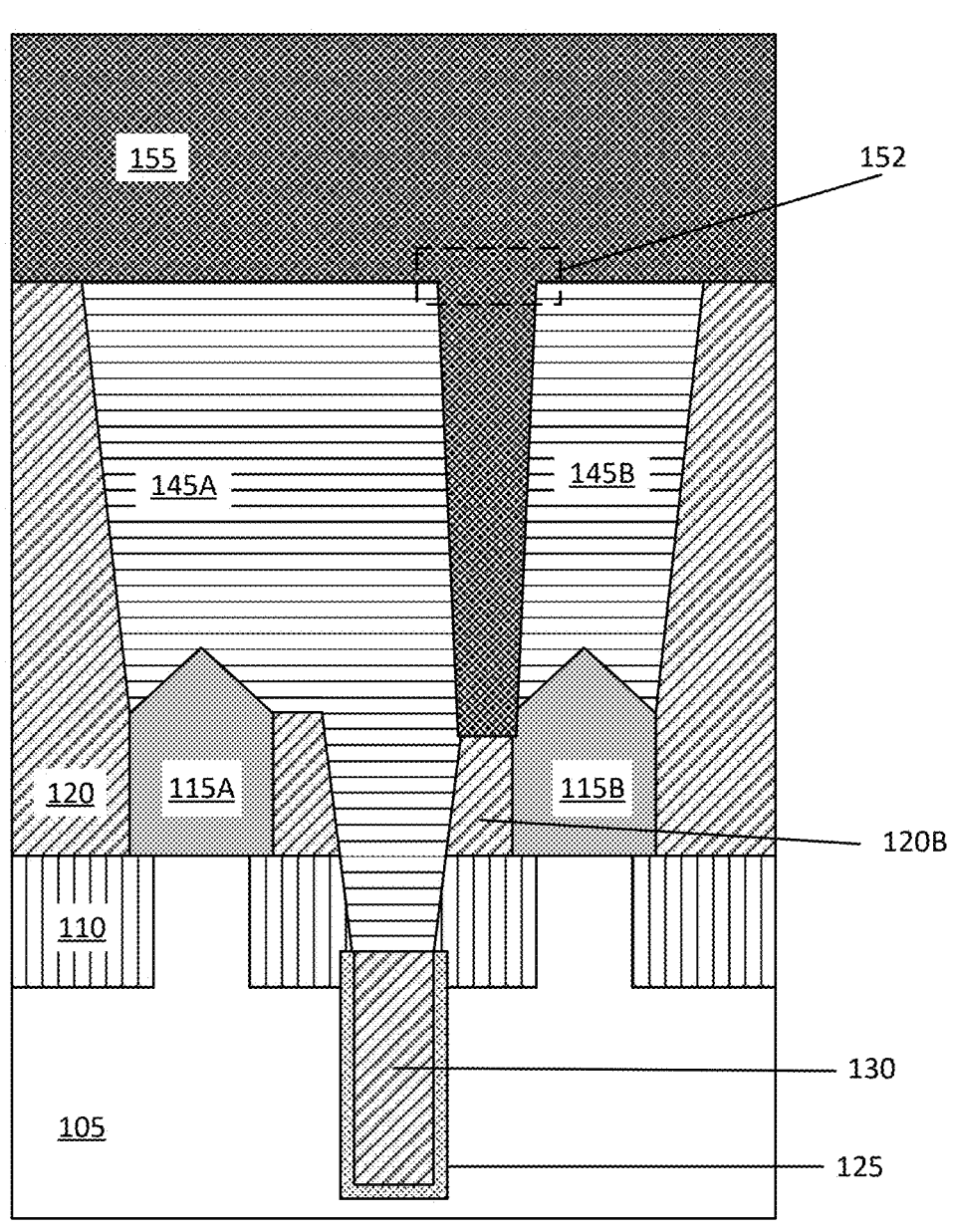
FIG. 31 illustrates a cross section of adjacent source/drains and a buried power rail after the formation of a second dielectric, in accordance with the embodiment of the present invention.

FIG. 31 illustrates a cross section of adjacent source/drains 115A, 115B and a buried power rail 130 after the formation of a second dielectric 155, in accordance with the embodiment of the present invention. A second dielectric 155 is formed on top of the dielectric layer 120, the left contact 145A, and the right contact 145B. The second dielectric 155 fills the separating trench 150, thus the second dielectric 155 located within the separating trench 150 acts as an isolation layer between the left contact 145A and the right contact 145B. The second dielectric 155 located in the separating trench 150 is in direct contact with a sidewall of the second source/drain 115, a sidewall of the right contact 145B, a sidewall of the left contact 145A, a top surface of the exposed section of the dielectric layer 120B, and a portion of the separating trench 150 filled with the material of the left contact 145A.

Figure 32:
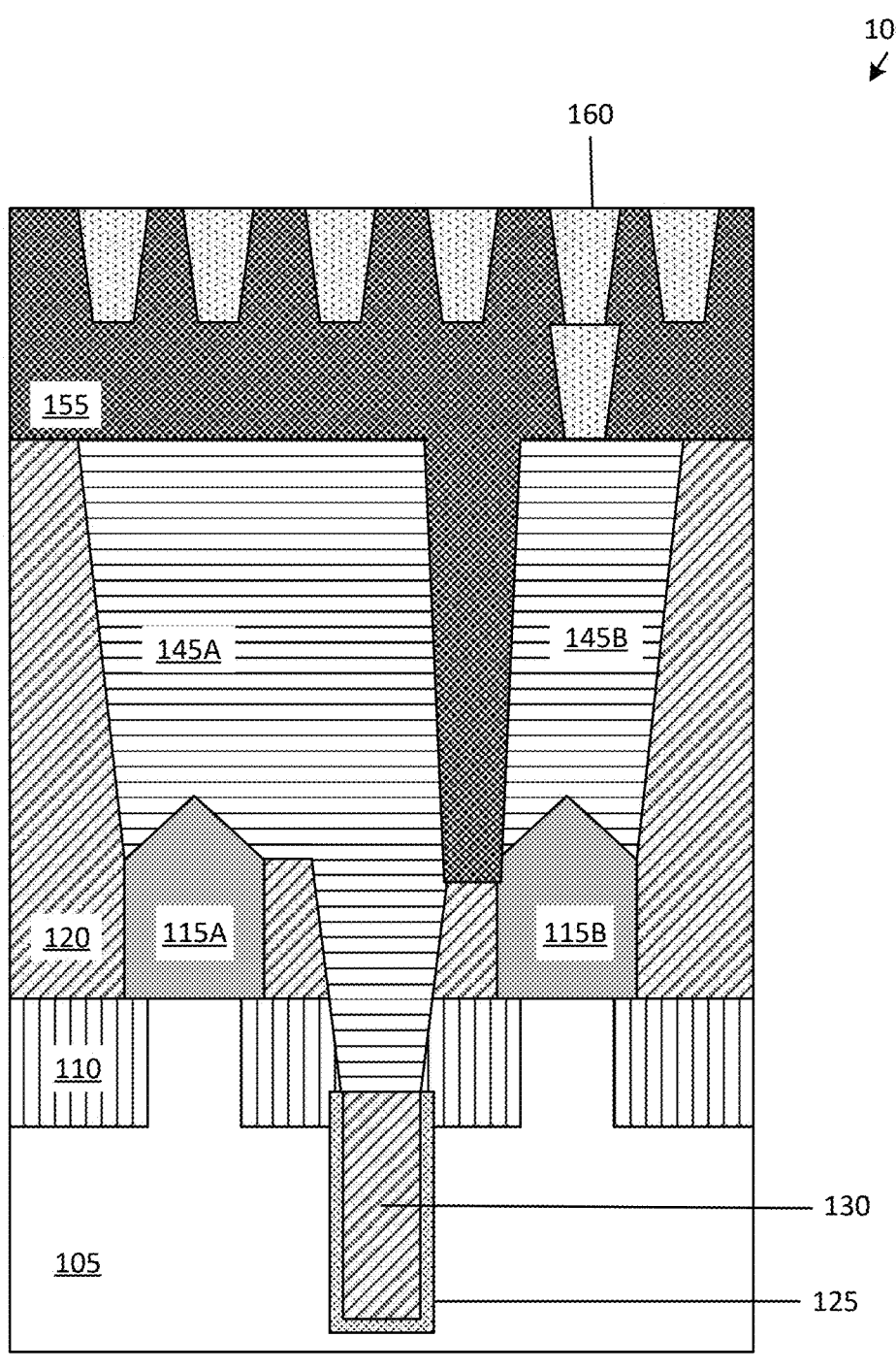
FIG. 32 illustrates a cross section of adjacent source/drains and a buried power rail after the formation of upper power rails in the second dielectric, in accordance with the embodiment of the present invention.

FIG. 32 illustrates a cross section of adjacent source/drains 115A, 115B and a buried power rail 130 after the formation of upper power rails 160 in the second dielectric 155, in accordance with the embodiment of the present invention. Upper power rail 160 are formed in the second dielectric 155. The upper power rail 160 is connected to a top surface of the right contact 145B by extending downwards through the second dielectric 155. The left contact 145A is connected to the buried power rail 130 and the right contact 145B is connected to the upper power rail 160. The left contact 145A and the right contact 145B are prevented from shorting each other out by the second dielectric 155 located in the separating trench 150. By cutting the separating trench 150, which has a large enough width W1 and depth D1, into the contact 145 to separate the contacts (left contact 145A and right contact 145B) ensures that enough dielectric material can be deposited between the left contact 145A and the right contact 145B.

Figure 33:
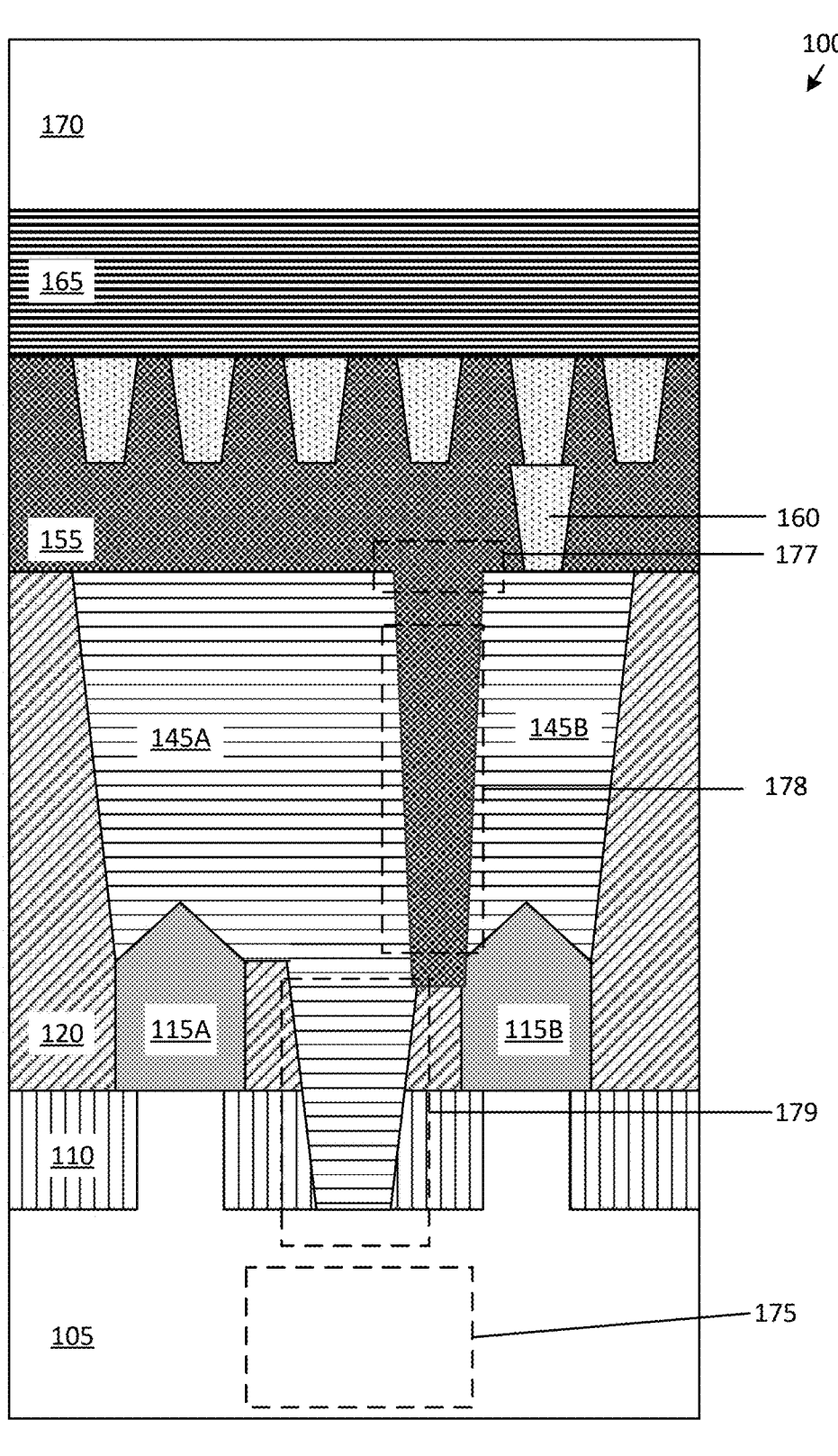
FIG. 33 illustrates a cross section of adjacent source/drains for a flip chip production, in accordance with the embodiment of the present invention.

FIG. 33 illustrates a cross section of adjacent source/drains 115A, 115B for a flip chip production, in accordance with the embodiment of the present invention.

The nano device 100 includes a substrate 105, a shallow trench isolation layer 110, a left source/drain 115A, a right source/drain 115B, a dielectric layer 120, a left contact 145A, a right contact 145B, a second dielectric 155, an upper power rail 160, a third dielectric 165, and a carrier wafer 170. The substrate 105 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or entire semiconductor substrate 105 may also be comprised of an amorphous, polycrystalline, or monocrystalline. The semiconductor substrate 105 may be doped, undoped or contain doped regions and undoped regions therein.

The left source/drain 115A and the right source/drain 115B can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

The left contact 145A includes a via section, as illustrated by dashed box 179, where the via section is located between the left source/drain 115A and the right source/drain 115B. The via section of the left contact 145A extends downwards through the shallow trench isolation layer 110 to the underlying substrate 105. The difference between FIG. 33 and FIG. 32, is that there is no buried power rail present when the left contact 145A was formed. Therefore, the power rail 180 will have to be added on later during processing, which will be described in further detail below. The second dielectric 155 includes a dielectric via section, as illustrated by dashed box 178, where the dielectric via section separates the left contact 145A and the right contact 145B. Dash box 177 illustrates the width of the dielectric via, where the width of the via is large enough to prevent the left contact 145A and the right contact 145B from shorting each other out. The third dielectric 165 is located on top of the second dielectric 155 and on top of the upper power rail 160. A carrier wafer 170 is attached to the top of the third dielectric 165, where the carrier wafer 170 allows for the flipping of the device for back side processing.

Figure 34:
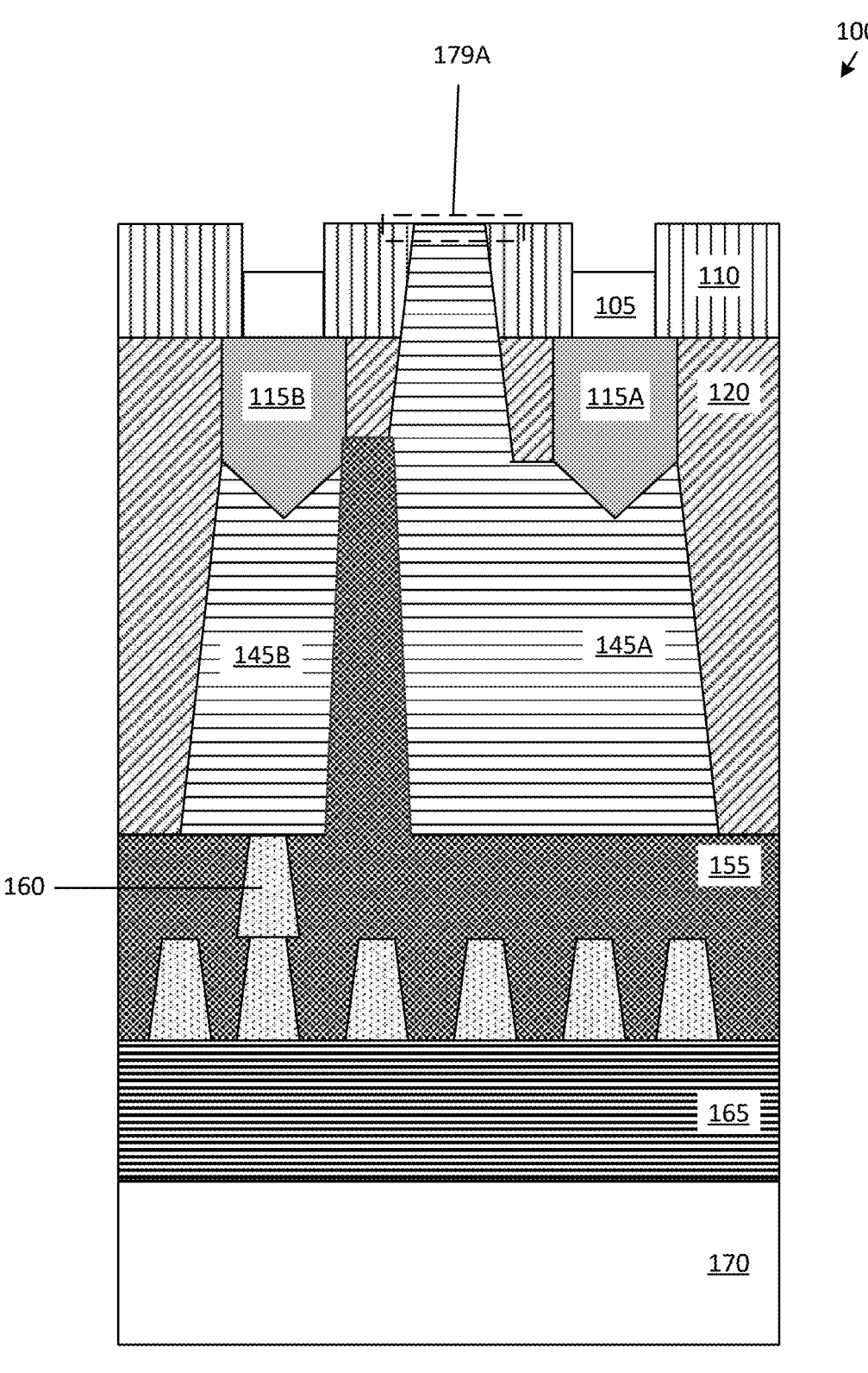
FIG. 34 illustrates a cross section of adjacent source/drains after the flipping of the device, in accordance with the embodiment of the present invention.

FIG. 34 illustrates a cross section of adjacent source/drains 115A, 115B after the flipping of the device, in accordance with the embodiment of the present invention.

The substrate 105 is etched back to expose a surface of the shallow trench isolation layer 110 and a surface of the left contact 145A via, as illustrated by dashed box 179A.

Figure 35:
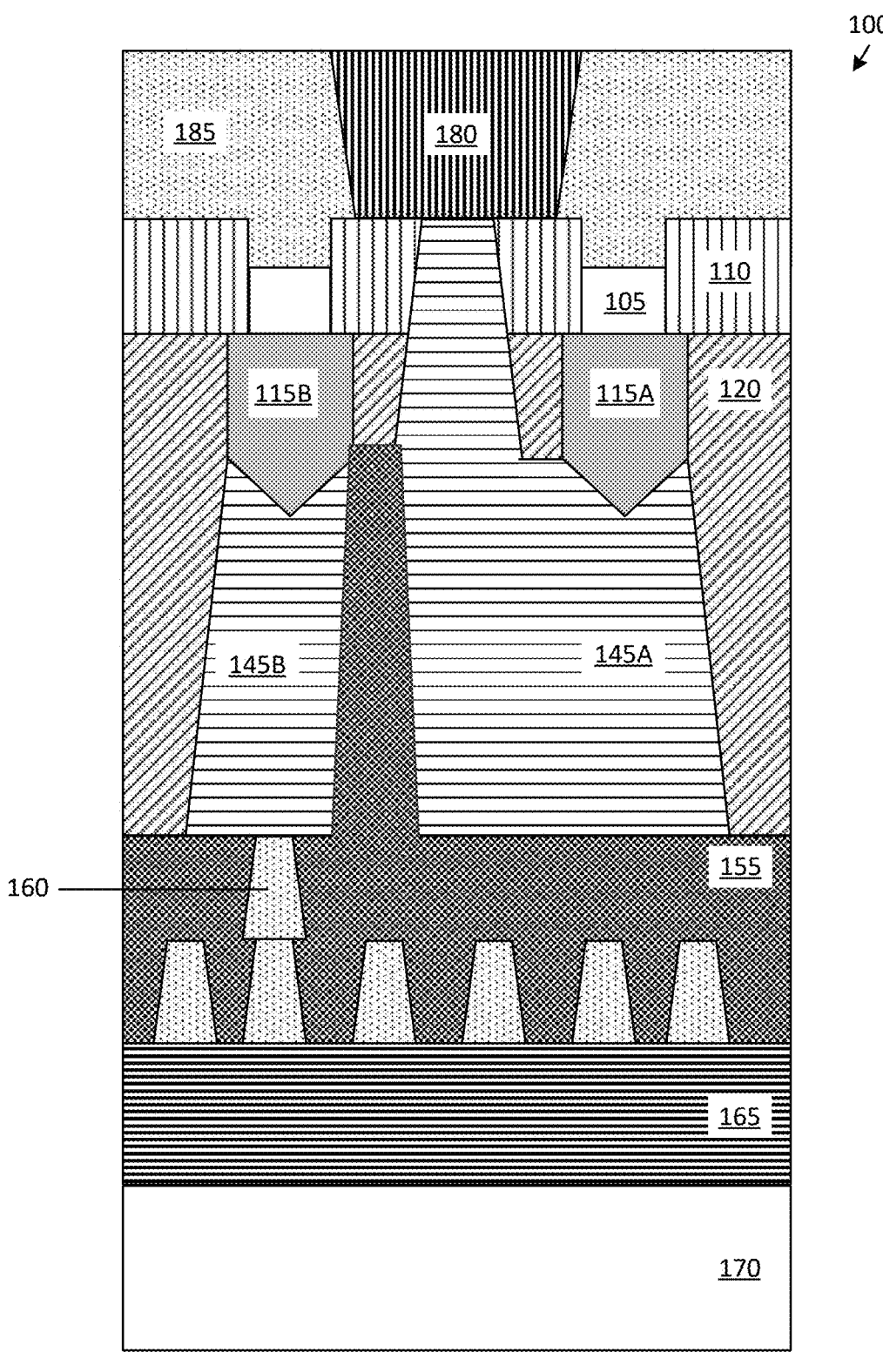
FIG. 35 illustrates a cross section of adjacent source/drains after formation of a power rail, in accordance with the embodiment of the present invention.

FIG. 35 illustrates a cross section of adjacent source/ drains 115A, 115B after formation of a back side power rail 180, in accordance with the embodiment of the present invention. A back side power rail 180 is formed on top of the exposed surface of the first contact 145 via section. A fourth dielectric 185 is formed around the back side power rail 180. The fourth dielectric 185 is also located on top of the shallow trench isolation layer 110 and on top of the remaining substrate 105. An advantage of forming the power rail 180 on a back-end processing is that the alignment of the back side power rail 180 and the left contact 145A via section is easier to achieve. It is easier to achieve because the size of the back side power rail 180 is not limited by the formation of a trench and furthermore it allows for the back side power rail 180 to overlap (i.e., larger in size) than the exposed surface of the left contact 145A.

Figure 36:
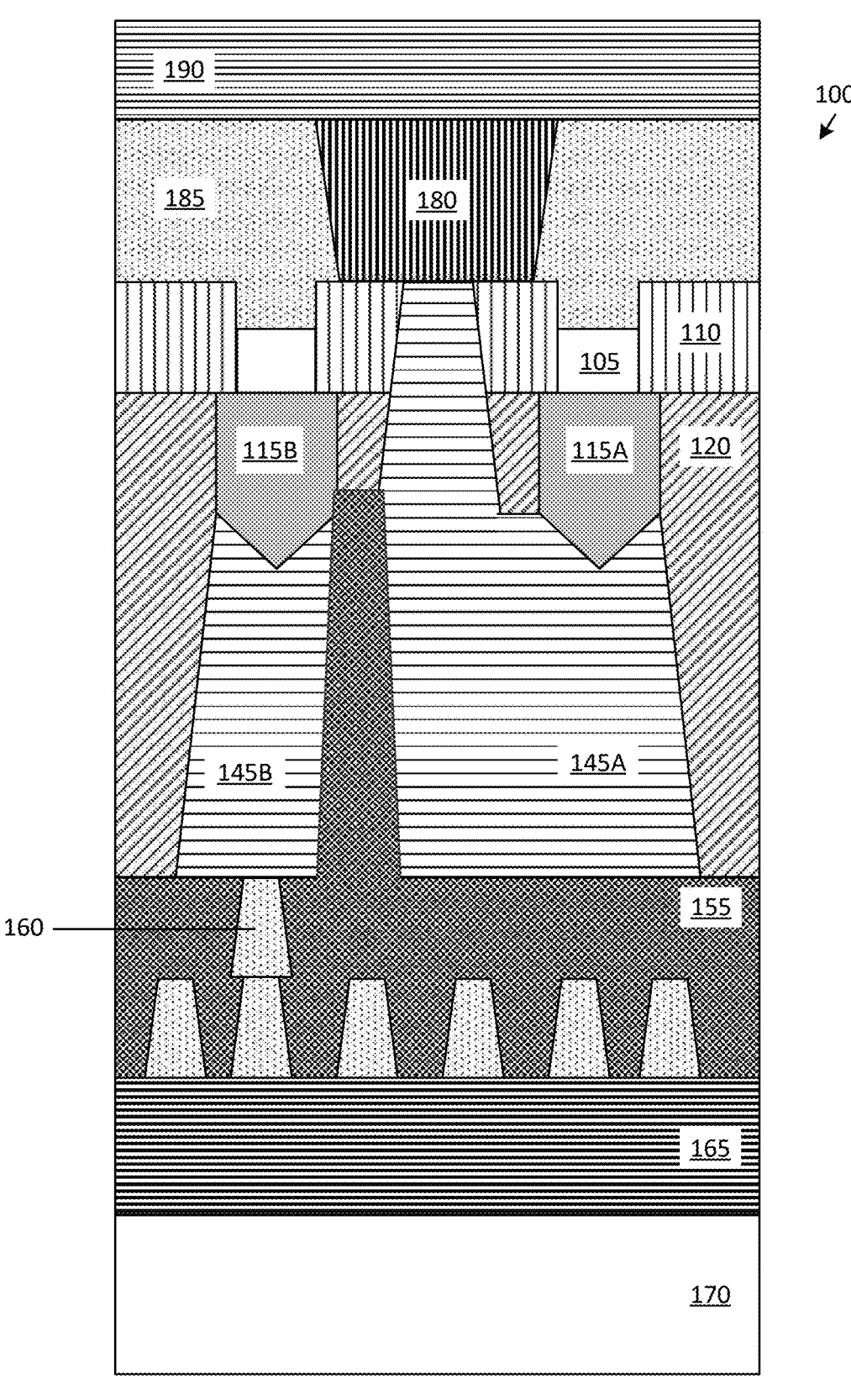
FIG. 36 illustrates a cross section of adjacent source/drains after formation of a cover layer, in accordance with the embodiment of the present invention.

FIG. 36 illustrates a cross section of adjacent source/ drains 115A, 115B after formation of a cover layer 190, in accordance with the embodiment of the present invention. A cover layer 190 is formed on top of the back side power rail 180 and the fourth dielectric 185. The left contact 145A is connected to the power rail 180 and the right contact 145B is connected to the upper power rail 160. The left contact 145A and the right contact 145B are prevented from shorting each other out by the second dielectric 155 located in trench 150. By cutting the trench 150, which has a large enough width W1 and depth D1, into the contact 145 to separate the contacts (left contact 145A and right contact 145B) ensures that that enough dielectric material can be deposited between the left contact 145A and the right contact 145B.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor device comprising:
a first nanodevice is located on a substrate, wherein the first nanodevice includes at least one channel;
a first source/drain connected to the first nanodevice;
a second nanodevice located on the substrate, wherein the second nanodevice includes at least one channel;
a second source/drain connected to the second nanodevice;
a first contact located above the first source/drain;
a second contact located above the second source/drain; and
a contact cap located on top of the first contact and the second contact, wherein the contact cap has a first leg that extends downwards between the first contact and the second contact, wherein the first leg of the contact cap is in direct contact with a first sidewall of the first contact, and a first sidewall of the second contact, wherein the first leg is in direct contact with the first source/drain and the second source/drain.

2. The semiconductor of claim 1, further comprising:
a first dielectric layer that is located around a portion of the first source/drain and a portion of the second source drain, wherein the first leg of the contact cap is in contact with a top surface of the first dielectric layer.

3. The semiconductor of claim 2, wherein the contact cap has a second leg that extend downwards, wherein the second leg of the contact cap is in contact with a second sidewall of the first contact, and a first sidewall of the first dielectric layer.

4. The semiconductor of claim 3, wherein the contact cap has a third leg that extend downwards, wherein the third leg of the contact cap is in contact with a second sidewall of the second contact, and a second sidewall of the first dielectric layer.

5. The semiconductor of claim 4, wherein the content cap is M-shaped.

6. The semiconductor of claim 1, wherein the content cap is T-shaped.

7. The semiconductor device of claim 6, wherein the first contact wraps around the first source/drain.

8. The semiconductor device of claim 7, wherein the first contact is in contact with a top surface of the first source/ drain, wherein the first contact is in contact with a sidewall of the first source/drain.

9. The semiconductor device of claim 8, wherein the second contact wraps around the second source/drain.

10. The semiconductor device of claim 9, wherein the second contact is in contact with a top surface of the second source/drain, wherein the second contact is in contact with a sidewall of the second source/drain.

11. The semiconductor device of claim 1, further comprising:
a first contact via extending through the contact cap to connect to the first contact; and
a second contact via extending through the contact cap to connect to the second contact.

12. A semiconductor device comprising:
a first nanodevice is located on a substrate, wherein the first nanodevice includes at least one channel;
a first source/drain connected to the first nanodevice;
a second nanodevice located on the substrate, wherein the second nanodevice includes at least one channel;
a second source/drain connected to the second nanodevice;
a first contact located above the first source/drain;
a second contact located above the second source/drain;
a contact cap located on top of the first contact and the second contact, wherein the contact cap has a first leg that extends downwards between the first contact and the second contact, wherein the first leg of the contact cap is in direct contact with a first sidewall of the first contact, and a first sidewall of the second contact, wherein the contact cap is T-shaped; and
a dielectric layer located beneath the contact cap and located beneath the first and second source/drain.

13. The semiconductor device of claim 12, wherein the first contact wraps around the first source/drain.

14. The semiconductor device of claim 13, wherein the first contact is in contact with a top surface of the first source/drain, wherein the first contact is in contact with a sidewall of the first source/drain.

15. The semiconductor device of claim 14, wherein the second contact wraps around the second source/drain.

16. The semiconductor device of claim 15, wherein the second contact is in contact with a top surface of the second source/drain, wherein the second contact is in contact with a sidewall of the second source/drain.

* * * * *